(12) United States Patent
Kamitsubo

(10) Patent No.: US 11,291,110 B2
(45) Date of Patent: Mar. 29, 2022

(54) RESIN SUBSTRATE AND ELECTRONIC DEVICE

(71) Applicant: Murata Manufacturing Co., Ltd., Nagaokakyo (JP)

(72) Inventor: Yusuke Kamitsubo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/037,869

(22) Filed: Sep. 30, 2020

(65) Prior Publication Data

US 2021/0014962 A1    Jan. 14, 2021

Related U.S. Application Data

(63) Continuation of application No. PCT/JP2019/046339, filed on Nov. 27, 2019.

(30) Foreign Application Priority Data

Dec. 13, 2018   (JP) .............................. JP2018-233364

(51) Int. Cl.
*H05K 1/02*        (2006.01)
*H05K 1/03*        (2006.01)
(Continued)

(52) U.S. Cl.
CPC ......... *H05K 1/0271* (2013.01); *H05K 1/0353* (2013.01); *H05K 1/11* (2013.01); *H05K 1/144* (2013.01); *H05K 3/0047* (2013.01); *H05K 3/101* (2013.01); *H05K 3/4038* (2013.01); *H05K 3/42* (2013.01); *H05K 2201/015* (2013.01);
(Continued)

(58) Field of Classification Search
CPC .......... H05K 1/02; H05K 1/0271; H05K 1/11; H05K 1/14; H05K 1/141–144; H05K 1/18; H05K 1/187–189; H05K 3/00; H05K 3/0047; H05K 3/101; H05K 3/42; H05K 3/4038; H05K 3/0014; H05K 3/0035;
(Continued)

(56) References Cited

U.S. PATENT DOCUMENTS 7,926,175 B2 *   4/2011   Ohara .................. H05K 3/4602
                                                                29/846
8,371,026 B2 *   2/2013   Nomiya .................. H01L 23/13
                                                                29/832
(Continued)

FOREIGN PATENT DOCUMENTS

JP       2008-198938 A       8/2008
JP       2009-200310 A       9/2009
(Continued)

OTHER PUBLICATIONS

Official Communication issued in International Patent Application No. PCT/JP2019/046339, dated Feb. 4, 2020.

*Primary Examiner* — Tuan T Dinh
(74) *Attorney, Agent, or Firm* — Keating & Bennett, LLP

(57) ABSTRACT

A resin substrate includes a resin body, an interlayer connection conductor provided in the resin body, and a conductor pattern bonded to the interlayer connection conductor. The resin body includes a gap provided adjacent to or in a vicinity of a bonding portion of the interlayer connection conductor and the conductor pattern, and a contact portion that contacts the interlayer connection conductor.

20 Claims, 25 Drawing Sheets

(51) Int. Cl.
*H05K 1/11* (2006.01)
*H05K 1/14* (2006.01)
*H05K 3/00* (2006.01)
*H05K 3/10* (2006.01)
*H05K 3/40* (2006.01)
*H05K 3/42* (2006.01)

(52) U.S. Cl.
CPC ........... *H05K 2201/0141* (2013.01); *H05K 2201/042* (2013.01); *H05K 2201/068* (2013.01); *H05K 2203/0207* (2013.01); *H05K 2203/0703* (2013.01)

(58) Field of Classification Search
CPC ...... H05K 2201/0141–0145; H05K 2201/015; H05K 2201/042
USPC ........ 361/760–762, 767–774, 792–795, 803; 174/258–268
See application file for complete search history.

(56) References Cited

U.S. PATENT DOCUMENTS

| | | | |
|---|---|---|---|
| 8,419,884 B2* | 4/2013 | Sekimoto | H05K 3/4614 156/272.2 |
| 8,822,828 B2* | 9/2014 | Asai | H01L 23/49827 174/255 |
| 9,265,147 B2* | 2/2016 | Itabashi | H01L 24/19 |
| 10,779,414 B2* | 9/2020 | Park | H05K 1/187 |
| 2005/0023033 A1* | 2/2005 | Saiki | H05K 3/305 174/260 |
| 2011/0155433 A1* | 6/2011 | Funaya | H01L 23/49827 174/258 |
| 2013/0027895 A1* | 1/2013 | Hayashi | H01L 23/145 361/760 |
| 2014/0318847 A1 | 10/2014 | Otsubo | |
| 2015/0096791 A1 | 4/2015 | Katsube | |
| 2015/0296613 A1* | 10/2015 | Matsui | H05K 1/181 174/255 |
| 2016/0372819 A1* | 12/2016 | Okamoto | H01Q 1/243 |
| 2018/0090451 A1* | 3/2018 | Matsubara | H01L 23/49822 |

FOREIGN PATENT DOCUMENTS

| | | |
|---|---|---|
| JP | 2015-076481 A | 4/2015 |
| JP | 2017-143099 A | 8/2017 |
| WO | 2013/111767 A1 | 8/2013 |

* cited by examiner

HEIGHT DIRECTION

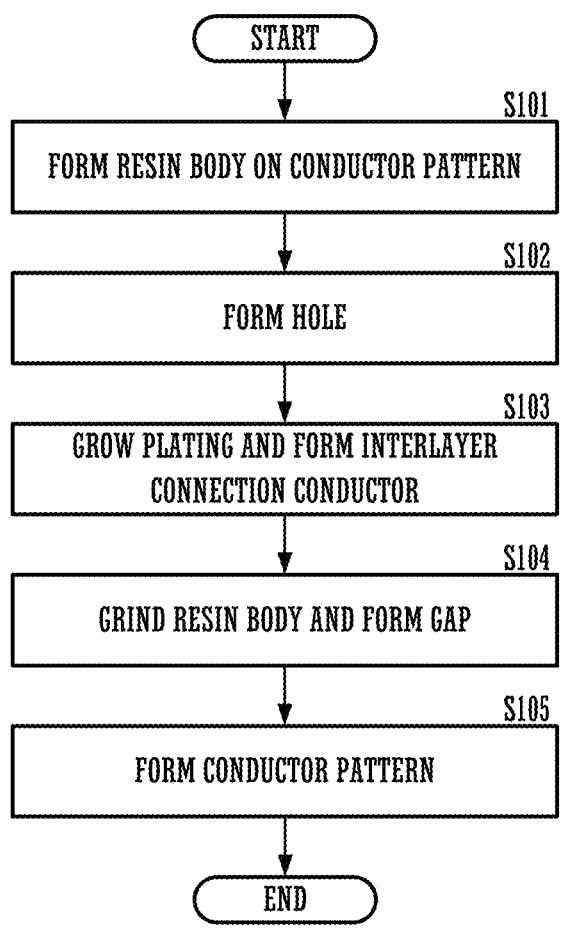

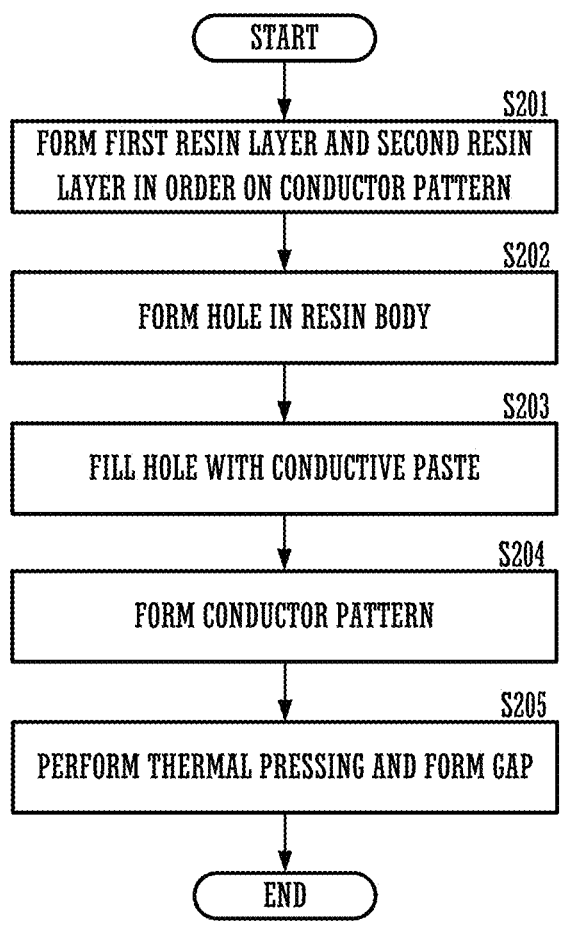

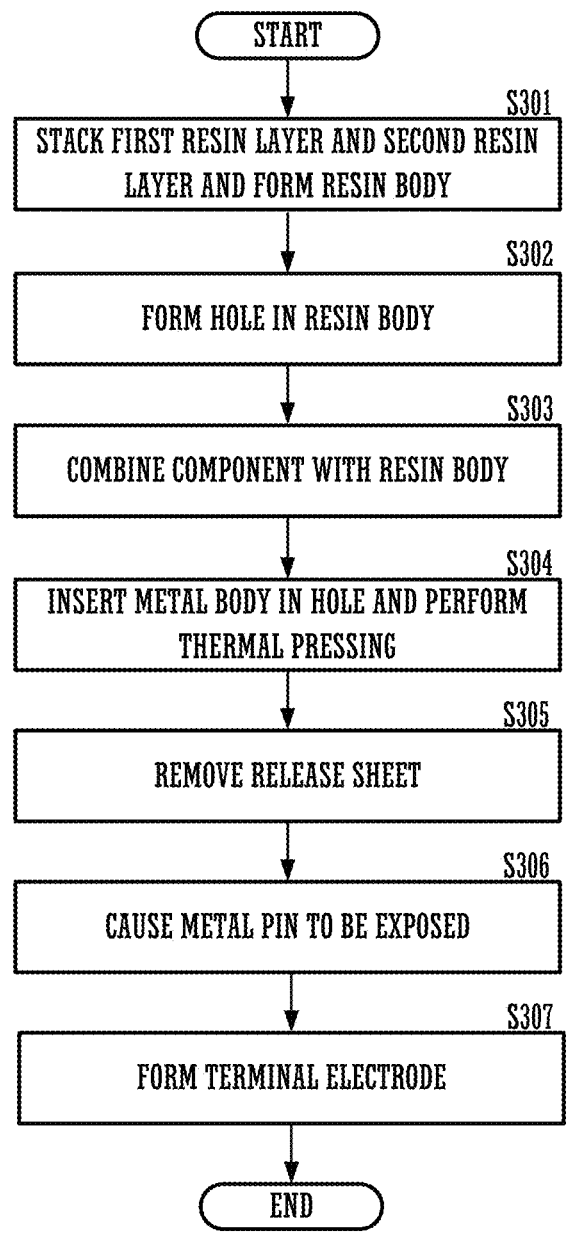

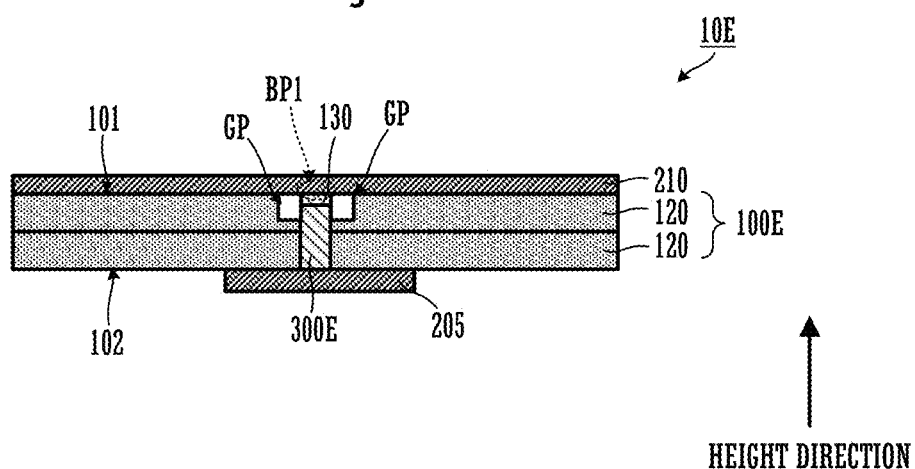

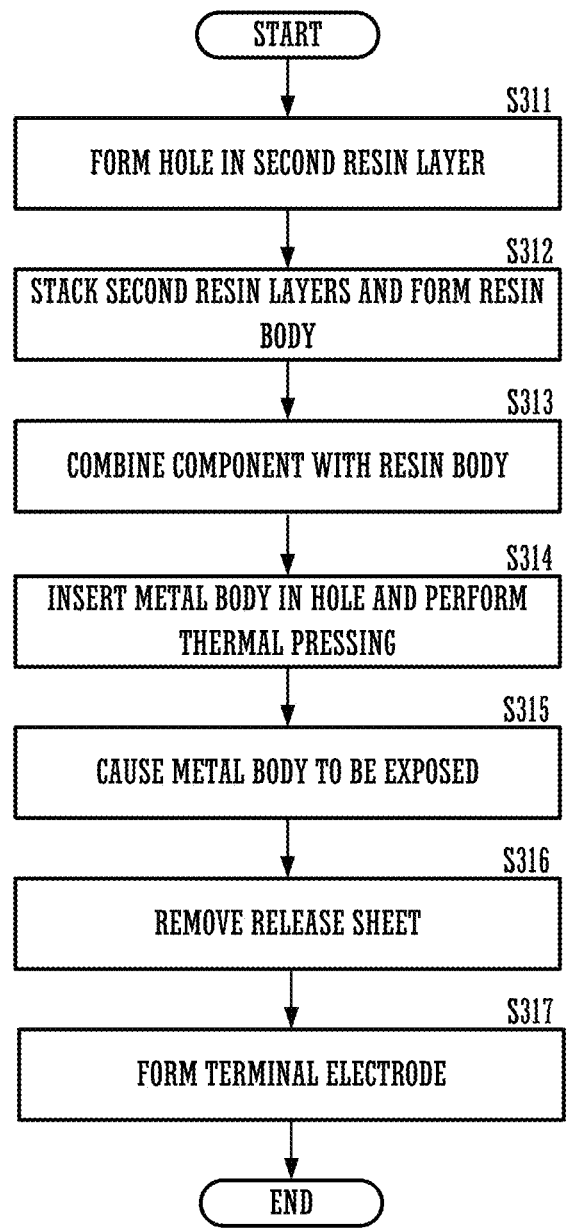

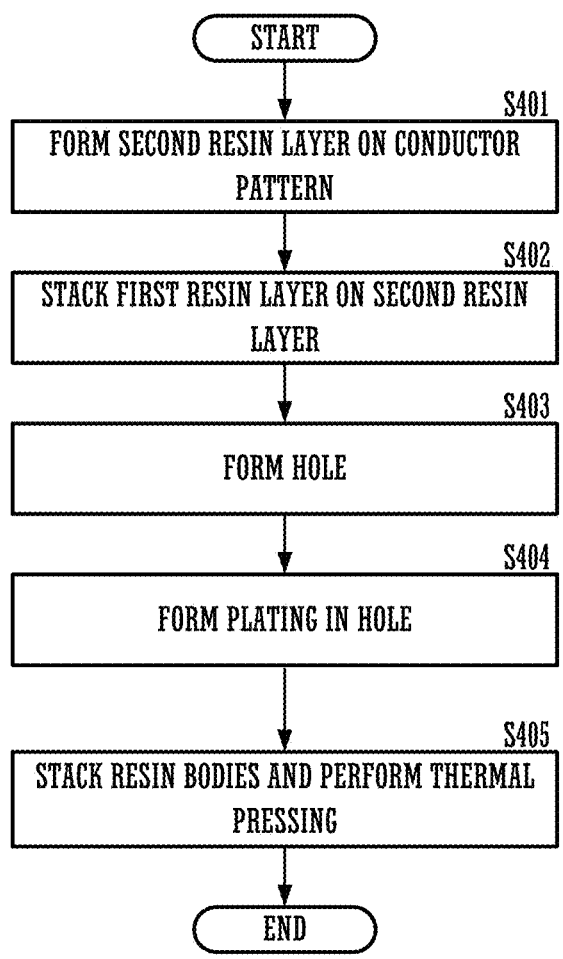

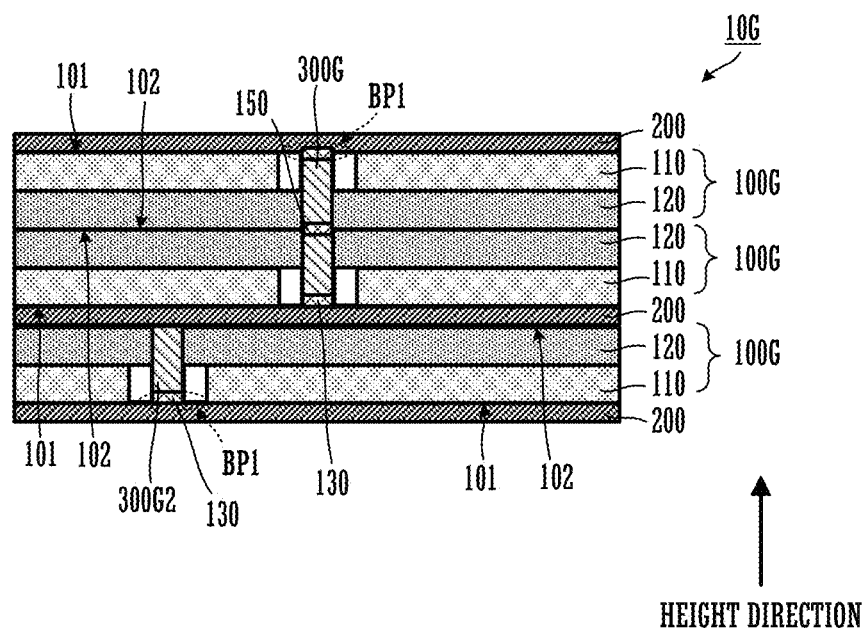

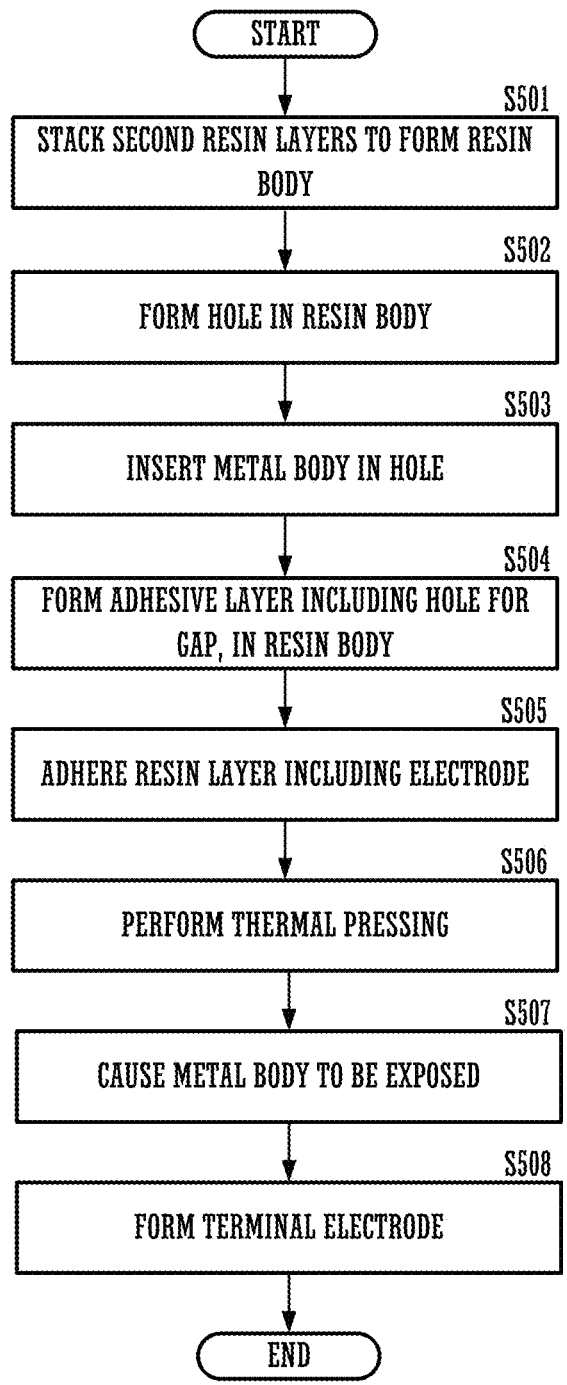

HEIGHT DIRECTION

RESIN SUBSTRATE AND ELECTRONIC DEVICE

CROSS REFERENCE TO RELATED APPLICATIONS

This application claims the benefit of priority to Japanese Patent Application No. 2018-233364 filed on Dec. 13, 2018 and is a Continuation Application of PCT Application No. PCT/JP2019/046339 filed on Nov. 27, 2019. The entire contents of each application are hereby incorporated herein by reference.

BACKGROUND OF THE INVENTION

1. Field of the Invention

The present invention relates to a resin substrate in which a plurality of resin layers are stacked on each other, and an interlayer connection conductor provided in the resin layers is connected to a conductor pattern.

2. Description of the Related Art

Conventionally, various types of resin substrates are practically used. For example, Japanese Unexamined Patent Application Publication No. 2017-143099 discloses a circuit board in which conductor patterns provided on both sides of an insulating base material made of a resin or the like are bonded to a via conductor that penetrates the insulating base material. In addition, International Publication No. 2013/111767 discloses a circuit board including a gap provided on the entire side surface of a via conductor.

In the configuration disclosed in Japanese Unexamined Patent Application Publication No. 2017-143099, in a case in which an external shock, bending stress, heat, or the like is exerted on the circuit board, stress is applied to a via conductor, which causes cracking to easily occur. Similarly, peeling may occur at or near a boundary of the via conductor and the conductor pattern.

In the configuration disclosed in International Publication No. 2013/111767, although the stress to a via conductor is reduced in a case in which an external shock, bending stress, heat, or the like is exerted on the circuit board, the stress concentrates on the boundary of the via conductor and the conductor pattern, which may cause breakage to occur on a boundary surface. Particularly, in terms of shape or structure, for example, an angle formed by the via conductor and the conductor pattern is an acute angle, so that breakage easily occurs at the boundary.

SUMMARY OF THE INVENTION

Preferred embodiments of the present invention provide resin substrates that are each able to significantly reduce or prevent breakage at a boundary of an interlayer connection conductor (a via conductor) and a conductor pattern.

A resin substrate according to a preferred embodiment of the present invention includes a resin body, an interlayer connection conductor provided in the resin body, and a conductor pattern bonded to the interlayer connection conductor. The resin body includes a gap provided adjacent to or in the vicinity of a bonding portion in which the interlayer connection conductor and the conductor pattern are bonded to each other, and a contact portion that contacts the interlayer connection conductor.

In this configuration, the resin substrate includes the gap provided at the bonding portion of the interlayer connection conductor and the conductor pattern on which stress concentrates most, so that peeling or cracking at the bonding portion of the interlayer connection conductor and the conductor pattern is able to be significantly reduced or prevented. In addition, the interlayer connection conductor includes a contact portion that contacts the resin body, so that the stress is able to be distributed to the bonding portion (a side surface of the interlayer connection conductor), and the stress to the bonding portion of the interlayer connection conductor and the conductor pattern is able to be further reduced or prevented.

According to preferred embodiments of the present invention, resin substrates that are each able to significantly reduce or prevent cracking and peeling of an interlayer connection conductor are able to be provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a flow chart of a method of manufacturing the resin substrate 10 according to the first preferred embodiment of the present invention.

FIG. 6 is a flow chart of a method of manufacturing the resin substrate 10A according to the second preferred embodiment of the present invention.

FIG. 11 is a flow chart of a method of manufacturing the resin substrate 10D according to the fourth preferred embodiment of the present invention.

FIG. 13 is a side cross-sectional view of a configuration of a resin substrate 10E according to a modification of the fourth preferred embodiment of the present invention.

FIG. 14 is a flow chart of a method of manufacturing the resin substrate 10E according to the modification of the fourth preferred embodiment of the present invention.

FIG. 17 is a flow chart of a method of manufacturing the resin substrate 10F according to the fifth preferred embodiment of the present invention.

FIG. 19 is a side cross-sectional view of a configuration of a resin substrate 10G according to a sixth preferred embodiment of the present invention.

FIG. 22 is a flow chart of a method of manufacturing the resin substrate 10J according to the eighth preferred embodiment of the present invention.

DETAILED DESCRIPTION OF THE PREFERRED EMBODIMENTS

Figure 1A:
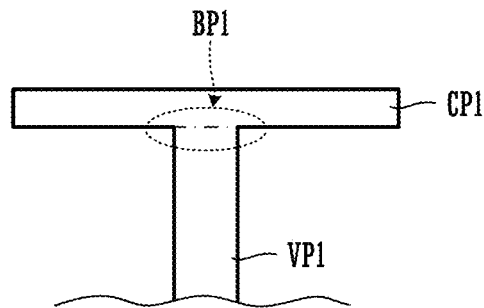
FIGS. 1A to 1C show a bonding portion in which an interlayer connection conductor and a conductor pattern according to a preferred embodiment of the present invention are bonded to each other.
Figure 1B:
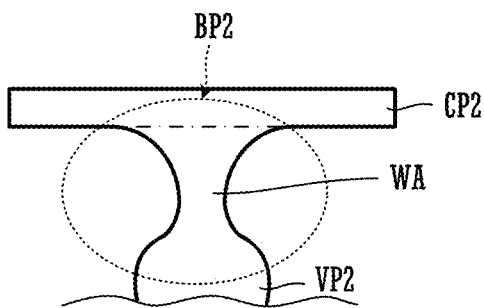
Figure 1C:
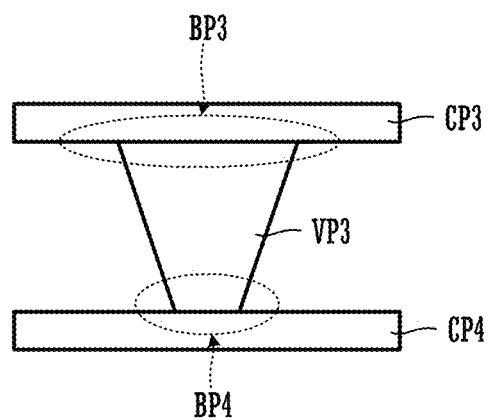

Definition of Bonding Portion of Interlayer Connection Conductor and Conductor Pattern The definition of a bonding portion of an interlayer connection conductor and a conductor pattern according to preferred embodiments of the present invention will be described with reference to the drawings. FIG. 1A to FIG. 1C are views that define a bonding portion of an interlayer connection conductor and a conductor pattern according to a preferred embodiment of the present invention. The bonding portion of an interlayer connection conductor and a conductor pattern according to preferred embodiments of the present invention is an area including a portion in which the interlayer connection conductor and the conductor pattern are bonded to each other. As shown in FIGS. 1A to 1C, the bonding portion has the following four shapes.

A bonding portion BP1 shown in FIG. 1A is formed by bonding an interlayer connection conductor VP1 parallel or substantially parallel to a height direction and a conductor pattern CP1 perpendicular or substantially perpendicular to the height direction. More specifically, the bonding portion BP1 has a shape in which the direction in which the interlayer connection conductor VP1 extends and the direction in which the conductor pattern CP1 extends are perpendicular or substantially perpendicular to each other. The bonding portion BP1 is referred to as a pattern 1.

A bonding portion BP2 shown in FIG. 1B includes a constricted portion WA. More specifically, the bonding portion BP2 has a shape including the constricted portion WA of which the width is locally small, in a position in which a conductor pattern CP2 perpendicular or substantially perpendicular to the height direction and an interlayer connection conductor VP2 made of a plated via or the like are bonded to each other. The bonding portion BP2 is referred to as a pattern 2.

As shown in FIG. 1C, an interlayer connection conductor VP3 has a tapered shape. A portion in which a conductor pattern CP3 and an interlayer connection conductor VP3 are bonded to each other is a bonding portion BP3, and the bonding portion BP3 is a portion of which the width in the tapered shape is large. A portion in which a conductor pattern CP4 and an interlayer connection conductor VP3 are bonded to each other is a bonding portion BP4, and is a portion of which the width in the tapered shape is small. The bonding portion BP3 is referred to as a pattern 3, and the bonding portion BP4 is referred to as a pattern 4.

The tapered shape of the bonding portions BP3 and BP4 shown in FIG. 1C will be described using an example in which the tapered shape is provided so as to form a predetermined angle between the conductor pattern CP3 and the interlayer connection conductor VP3 and between the conductor pattern CP4 and the interlayer connection conductor VP3, in a plan view of the cross-sectional surface of the bonding portions BP3 and BP4. However, the bonding portions BP3 and BP4 may have, for example, a gently curved shape (a shape with an inflexion portion).

While the patterns are applied, a resin substrate according to the present invention will be described in detail by using the following preferred embodiments. In each of the drawings in the following preferred embodiments, the vertical and horizontal dimensional relationship is emphasized as appropriate, and does not always match the actual vertical and horizontal dimensional relationship. In addition, in order to make the drawings easy to see, some reference signs are omitted.

First Preferred Embodiment

A resin substrate according to a first preferred embodiment of the present invention will be described with reference to the drawings. The first preferred embodiment corresponds to a case in which an interlayer connection conductor is formed by plating, for example.

Figure 2A:
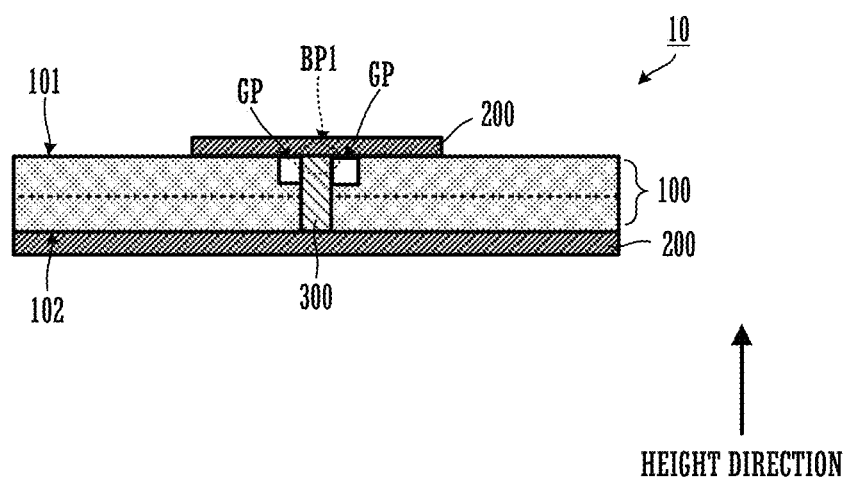
FIG. 2A is a side cross-sectional view of a configuration of a resin substrate 10 according to a first preferred embodiment of the present invention.
Figure 2B:
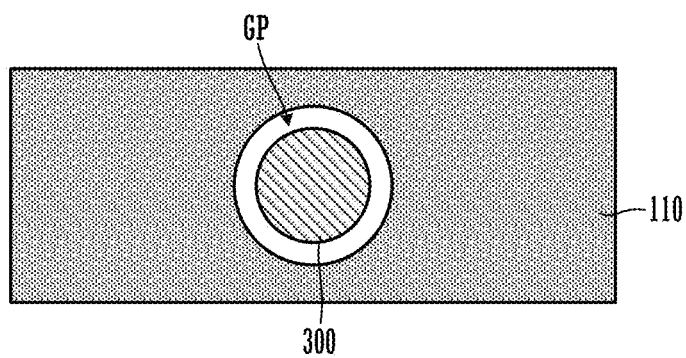
FIG. 2B is a cross-sectional view of FIG. 2A as viewed from a top surface side.

FIG. 2A is a side cross-sectional view of a configuration of a resin substrate 10 according to a first preferred embodiment of the present invention, and FIG. 2B is a cross-sectional view of FIG. 2A as viewed from a top surface side. FIG. 3 is a flow chart of a non-limiting example of a method of manufacturing the resin substrate 10 according to the first preferred embodiment of the present invention. FIGS. 4A to 4E are side cross-sectional views of the method of manufacturing the resin substrate 10 according to the first preferred embodiment of the present invention. The first preferred embodiment describes a case of the shape of the pattern 1 shown in FIG. 1A.

Structure of Resin Substrate

As shown in FIGS. 2A and 2B, the resin substrate 10 includes a resin body 100, conductor patterns 200, and an interlayer connection conductor 300. The resin substrate 10 has a rectangular parallelepiped or substantially rectangular parallelepiped shape in a plan view. FIG. 2B is a cross-sectional view of a portion including a gap GP, in a plan view on a surface parallel or substantially parallel to the conductor patterns 200.

The resin body 100 includes a first main surface 101 and a second main surface 102. The resin body 100 may include one resin layer or may include a plurality of resin layers.

The conductor patterns 200 are provided on each of the first main surface 101 and the second main surface 102 of the resin body 100.

The interlayer connection conductor 300 extends in a height direction of the resin body 100. The interlayer connection conductor 300 connects the conductor pattern 200 of the first main surface 101 and the conductor pattern 200 of the second main surface 102.

The conductor patterns 200 and the interlayer connection conductor 300 are made of the same material, and the interlayer connection conductor 300 is formed by plating. Such a configuration makes it possible to increase connection strength of the conductor pattern 200 and the interlayer connection conductor 300.

A bonding portion BP1 is provided in a portion in which the conductor pattern 200 and the interlayer connection conductor 300 are bonded to each other. According to preferred embodiments of the present invention, even such a case is classified into bonding, and the portion that bonds the conductor pattern 200 and the interlayer connection conductor 300 is referred to as the bonding portion BP1. In addition, a gap GP is provided adjacent to or in the vicinity of the bonding portion BP1, that is, adjacent to or in the vicinity of the first main surface 101 of the resin body 100.

In such a configuration, when a cross-sectional area of the conductor pattern 200 and a cross-sectional area of the interlayer connection conductor 300 when the boundary of the conductor pattern 200 and the interlayer connection conductor 300, that is, the bonding portion BP1, is viewed in a plan view on the surface parallel or substantially parallel to the conductor pattern 200, are compared, the area of the conductor pattern 200 drastically changes (reduces). Therefore, a corner portion (including the shape with an inflexion portion) that has a predetermined angle is provided between the conductor pattern 200 and the interlayer connection conductor 300 when a cross-sectional surface of the bonding portion BP 1 of the conductor pattern 200 and the interlayer connection conductor 300 is viewed in a plan view, so that the boundary of the conductor pattern 200 and the interlayer connection conductor 300 becomes structurally fragile.

Without the gap GP, in a case in which an external shock, bending stress, heat (hereinafter referred to as an external force), or the like is exerted on the resin substrate 10, the external force is applied to the bonding portion BP1 of the conductor pattern 200 and the interlayer connection conductor 300. Consequently, peeling or cracking of the conductor pattern 200 and the interlayer connection conductor 300 may easily occur at the bonding portion BP1 as a starting point.

However, the gap GP is provided adjacent to or in the vicinity of the bonding portion BP1 of the interlayer connection conductor 300 and the conductor pattern 200, which makes it possible to significantly reduce or prevent the stress concentrated on the bonding portion BP1. In other words, peeling or cracking of the interlayer connection conductor 300 and the conductor pattern 200 is able to be significantly reduced or prevented. Furthermore, a central area of the interlayer connection conductor 300 in the direction in which the interlayer connection conductor 300 extends contacts the resin body 100. As a result, a positional shift of the interlayer connection conductor 300 is able to be significantly reduced or prevented, and the stress to the bonding portion BP1 is able to be further reduced or prevented.

The material of each component is, for example, as follows. The resin body 100 is preferably made of a polyimide type resin or LCP, for example. The resin body 100 may be made of a fluororesin. More specifically, the fluororesin includes polytetrafluoroethylene (PTFE), perfluoroalkoxy alkane (PFA), ethylene-tetrafluoroethylene copolymer (ETFE), and perfluoroethylene-propene copolymer (FEP), for example. Such a configuration increases chemical resistance, heat resistance, and electrical characteristics.

The conductor patterns 200 and the interlayer connection conductor 300 are preferably made of a material including Cu, for example.

Method of Manufacturing Resin Substrate

Hereinafter, a non-limiting example of a method of manufacturing the resin substrate 10 will be described. FIG. 3 is a flow chart of a method of manufacturing the resin substrate 10. FIGS. 4A to 4E are cross-sectional views of a shape in a main step in the method of manufacturing the resin substrate 10.

Figure 4A:
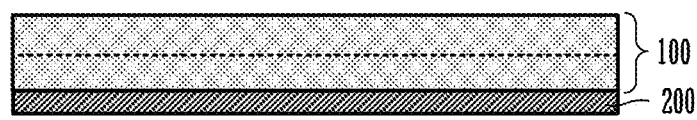
FIGS. 4A to 4E are side cross-sectional views of the method of manufacturing the resin substrate 10 according to the first preferred embodiment of the present invention.

As shown in FIG. 3 and FIG. 4A, a resin body 100 is formed on a conductor pattern 200 by a cast method (S101).

Figure 4B:
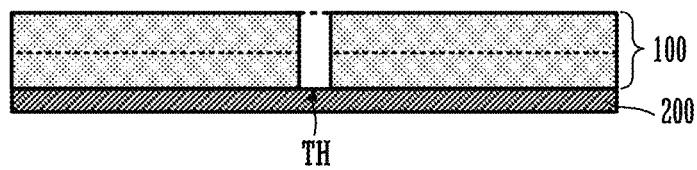

As shown in FIG. 3 and FIG. 4B, a hole TH is formed in the resin body 100 by a drill or another suitable device (S102), for example. It is to be noted that the hole TH is formed so as to penetrate the resin body 100.

Figure 4C:
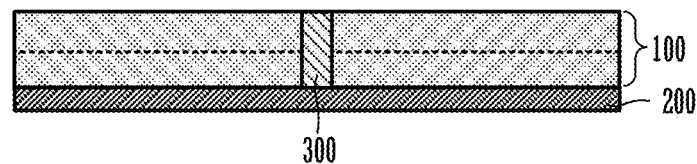

As shown in FIG. 3 and FIG. 4C, the conductor pattern 200 is used as a base and plating is grown in the hole TH to form the interlayer connection conductor 300 (S103).

Figure 4D:
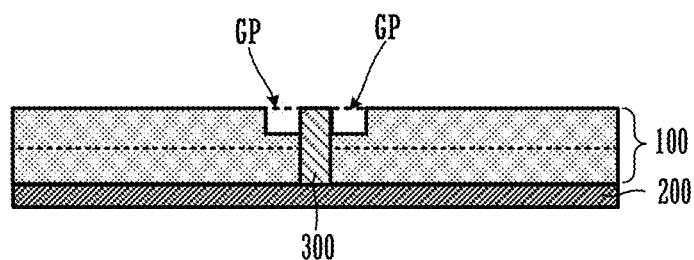

As shown in FIG. 3 and FIG. 4D, the resin body 100 on the side on which the conductor pattern 200 is not formed is ground by a drill or another suitable device, for example, to form a gap GP (S104).

Figure 4E:
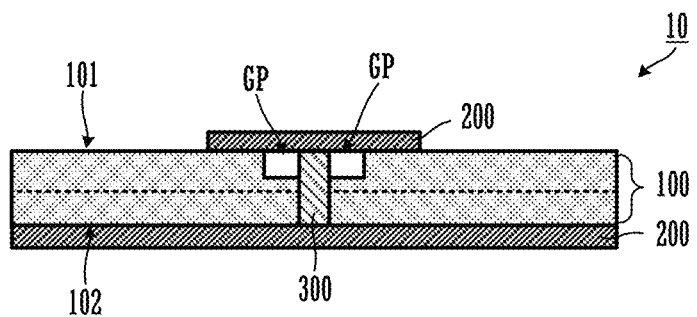

As shown in FIG. 3 and FIG. 4E, masking is performed on the gap GP. Next, plating is formed on the interlayer connection conductor 300 to form the conductor pattern 200. Subsequently, the material used for the masking is removed (S105).

The use of such a manufacturing method makes it possible to reliably and highly accurately achieve a configuration of the above-described resin substrate 10.

Second Preferred Embodiment

A resin substrate according to a second preferred embodiment of the present invention will be described with reference to the drawings. The second preferred embodiment corresponds to a case in which an interlayer connection conductor is formed by conductive paste, for example.

Figure 5:
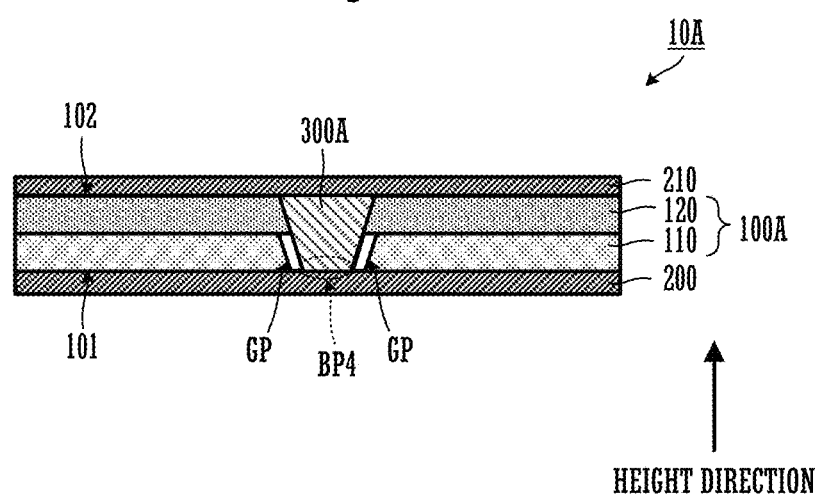
FIG. 5 is a side cross-sectional view of a configuration of a resin substrate 10A according to a second preferred embodiment of the present invention.

FIG. 5 is a side cross-sectional view of a configuration of a resin substrate 10A according to the second preferred embodiment of the present invention. FIG. 6 is a flow chart of a non-limiting example of a method of manufacturing the resin substrate 10A according to the second preferred embodiment of the present invention. FIGS. 7A to 7E are side cross-sectional views of the method of manufacturing the resin substrate 10A according to the second preferred embodiment of the present invention. The second preferred embodiment describes a case of the shape of the pattern 4 shown in FIG. 1C.

As shown in FIG. 5, the resin substrate 10A according to the second preferred embodiment is different from the resin substrate 10 according to the first preferred embodiment in that a first resin layer 110 and a second resin layer 120 define a resin body 100A and in that an interlayer connection conductor 300A has a tapered shape. Other basic features of the resin substrate 10A are the same as or similar to the basic features of the resin substrate 10, and a description of the same or similar features will be omitted.

Structure of Resin Substrate

As shown in FIG. 5, the resin substrate 10A includes a resin body 100A, conductor patterns 200 and 210, and an interlayer connection conductor 300A.

The resin body 100A includes a first resin layer 110 and a second resin layer 120. The resin body 100A includes a first main surface 101 and a second main surface 102. The first main surface 101 is a surface of the first resin layer 110 opposite to a surface in contact with the second resin layer 120, and the second main surface 102 is a surface of the second resin layer 120 opposite to a surface in contact with the first resin layer 110.

The conductor pattern 200 is provided on the first main surface 101, and the conductor pattern 210 is provided on the second main surface 102. The interlayer connection conductor 300A extends in a height direction of the resin body 100A. The interlayer connection conductor 300A is bonded to the conductor patterns 200 and 210.

The interlayer connection conductor 300A has a tapered shape. More specifically, the interlayer connection conductor 300A has a shape tapered from the second main surface 102 toward the first main surface 101.

A bonding portion BP4 is provided in a portion in which the conductor pattern 200 and the interlayer connection conductor 300A are bonded to each other. In addition, a gap GP is provided adjacent to or in the vicinity of the bonding portion BP4, that is, in the first resin layer 110 being the first main surface 101 of the resin body 100A.

Without the gap GP, external stress is concentrated on the bonding portion BP4 of the conductor pattern 200 and the interlayer connection conductor 300A. Consequently, peeling or cracking of the conductor pattern 200 and the interlayer connection conductor 300A may easily occur at the bonding portion BP4 as a starting point.

With this configuration, the gap GP is provided adjacent to or in the vicinity of the bonding portion BP4 of the interlayer connection conductor 300A and the conductor pattern 200, which makes it possible to significantly reduce or prevent the stress concentrated on the bonding portion BP4. In other words, peeling or cracking of the interlayer connection conductor 300A and the conductor pattern 200 is able to be significantly reduced or prevented. Furthermore, the interlayer connection conductor 300A contacts the second resin layer 120. Accordingly, the stress to the bonding portion BP4 is able to be further reduced or prevented.

It is to be noted that the relationship between the gap GP and the interlayer connection conductor 300A may satisfy the following conditions. The second resin layer 120 includes a contact portion that contacts the interlayer connection conductor 300A. Herein, a contact ratio is obtained by dividing an area (a first area) in which the first resin layer 110 contacts the interlayer connection conductor 300A by an area (a second area) in which the second resin layer 120 contacts the interlayer connection conductor 300A.

At this time, the contact ratio is set to be smaller than 1. That is to say, the first area is smaller than the second area. In other words, the first resin layer 110 has a smaller area in contact with interlayer connection conductor 300A than the second resin layer 120.

In such a case, the area of the contact portion in the second resin layer 120 is greater than the area of the contact portion in the first resin layer 110. Accordingly, external stress or bending stress exerted on the bonding portion BP4 of the interlayer connection conductor 300A is able to be distributed to the contact portion of the second resin layer 120. As a result, occurrence of peeling or cracking of the bonding portion BP4 of the conductor pattern 200 and the interlayer connection conductor 300A is able to be significantly reduced or prevented, and occurrence of cracking to the interlayer connection conductor 300A is also able to be significantly reduced or prevented.

The material of each component is, for example, as follows. The first resin layer 110 and the second resin layer 120 have a different thermal expansion coefficient. The first resin layer 110 is preferably made of a polyimide type resin, for example. The second resin layer 120 is preferably made of a liquid crystal polymer (LCP), for example. It is to be noted that, as long as the thermal expansion coefficient (a first thermal expansion coefficient) of the first resin layer 110 is greater than the thermal expansion coefficient (a second thermal expansion coefficient) of the second resin layer 120, other combinations may be used.

The interlayer connection conductor 300A is preferably made of a material including Cu, Sn, or Ag, for example. The thermal expansion coefficient of the interlayer connection conductor 300A is smaller than the thermal expansion coefficient of the first resin layer 110 and the second resin layer 120.

An intermetallic compound is provided at the bonding portion BP4 to be formed when the conductor pattern 200 and the interlayer connection conductor 300A are bonded to each other. In the intermetallic compound, a material included in the conductor pattern 200 and a material included in the interlayer connection conductor 300A are combined at a fixed ratio. In a case in which Sn, Ag, or the like is included in the interlayer connection conductor 300A, Sn, Ag, or the like is diffused in the bonding portion BP4. More specifically, the melting point of Sn, Ag, or the like included in the interlayer connection conductor 300A is lower than the melting point of Cu, so that an intermetallic compound (an alloy layer) such as Cu—Sn, Sn—Ag, or Cu—Sn—Ag, for example, is formed at a low temperature when thermal pressing or a similar process is performed. Therefore, the interlayer connection conductor 300A and the conductor pattern 200 are able to be easily bonded to each other.

On the other hand, since the intermetallic compound is provided in the bonding portion BP4, the strength of bonding portion BP4 is reduced. In other words, the bonding portion BP4 includes an intermetallic compound (an alloy layer) including Sn, Ag, or the like, for example, being a fragile material, so that breakage may easily occur at the bonding portion BP4 as a starting point due to external stress or the like.

However, the gap GP is provided adjacent to or in the vicinity of the bonding portion BP4 of the interlayer connection conductor 300A and the conductor pattern 200, which makes it possible to significantly reduce or prevent peeling or cracking.

Method of Manufacturing Resin Substrate

Hereinafter, a non-limiting example of a method of manufacturing the resin substrate 10A will be described. FIG. 6 is a flow chart of a method of manufacturing the resin substrate 10A. FIGS. 7A to 7E are cross-sectional views of a shape in a main step in the method of manufacturing the resin substrate 10A.

Figure 7A:
FIGS. 7A to 7E are side cross-sectional views of the method of manufacturing the resin substrate 10A according to the second preferred embodiment of the present invention.

As shown in FIG. 6 and FIG. 7A, a first resin layer 110 is formed on a conductor pattern 200 by a cast method, and a second resin layer 120 is stacked on the first resin layer 110 (S201). The resin body 100A includes the first resin layer 110 and the second resin layer 120.

Figure 7B:
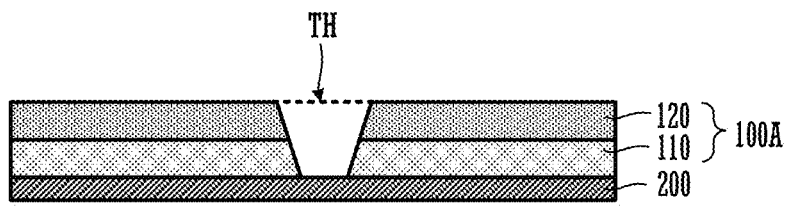

As shown in FIG. 6 and FIG. 7B, a hole TH is formed in the first resin layer 110 and the second resin layer 120 by a drill or another suitable device (S202), for example. It is to be noted that the hole TH is formed so as to penetrate the first resin layer 110 and the second resin layer 120.

Figure 7C:
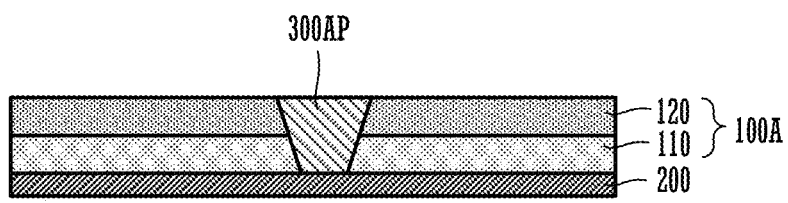

As shown in FIG. 6 and FIG. 7C, the hole TH is filled with conductive paste 300AP (S203).

Figure 7D:
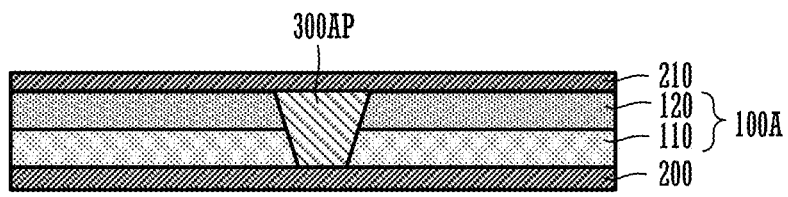

As shown in FIG. 6 and FIG. 7D, a conductor pattern 210 is formed (S204).

Figure 7E:
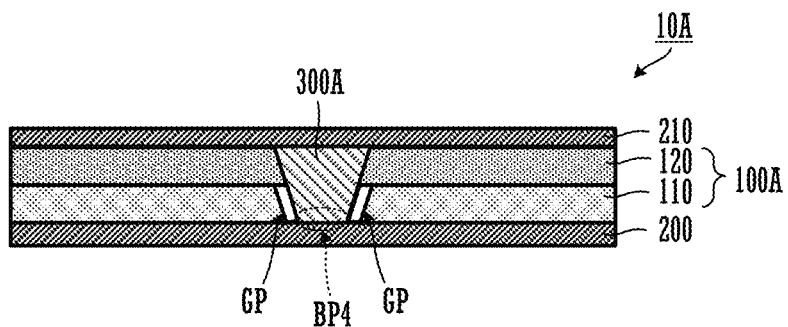

As shown in FIG. 6 and FIG. 7E, a structure formed in Step S204 is heated and pressed (S205). The temperature at the time of the heating and pressing is about 300° C., for example. Through such heating and pressing, the conductive paste 300AP is cured to provide an interlayer connection conductor 300A, and the boundary surface (the bonding portion BP4) of the conductor pattern 200, 210 and the interlayer connection conductor 300A is alloyed. As a result, the conductor pattern 200, 210 and the interlayer connection conductor 300A are bonded to each other.

The thermal expansion coefficient of the first resin layer 110 is greater than the thermal expansion coefficient of the second resin layer 120. Therefore, the resin body 100A is heated and then cooled, so that a gap GP is formed between the first resin layer 110 and the interlayer connection conductor 300A due to the difference in the thermal expansion coefficients of the first resin layer 110 and the second resin layer 120.

The use of such a manufacturing method makes it possible to reliably and highly accurately achieve a configuration such as the above-described resin substrate 10A.

Modification of Second Preferred Embodiment

Figure 8:
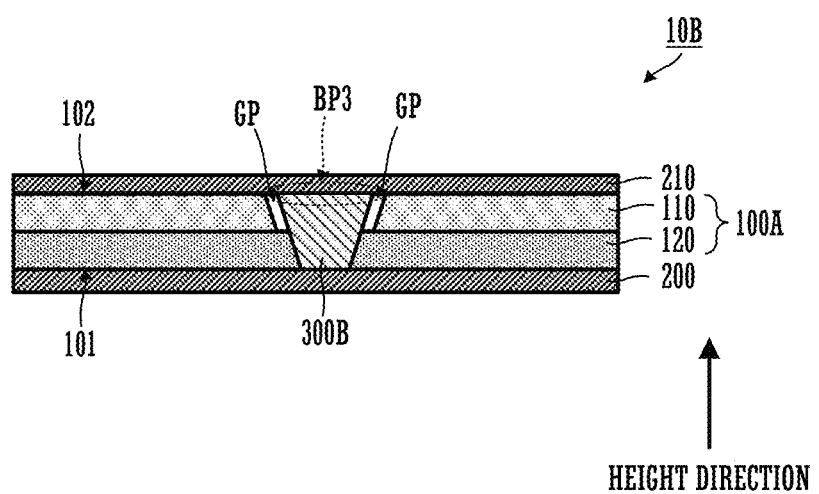
FIG. 8 is a side cross-sectional view of a configuration of a resin substrate 10B according to a modification of the second preferred embodiment of the present invention.

A resin substrate according to a modification of the second preferred embodiment of the present invention will be described with reference to the drawings. FIG. 8 is a side cross-sectional view of a configuration of a resin substrate 10B according to the modification of the second preferred embodiment of the present invention. The modification of the second preferred embodiment describes a case of the shape of the pattern 3 shown in FIG. 1C.

As shown in FIG. 8, the resin substrate 10B according to the modification of the second preferred embodiment is different in the position in which a gap GP is provided from the resin substrate 10A according to the second preferred embodiment. Other basic features of the resin substrate 10B are the same as or similar to the basic features of the resin substrate 10A, and a description of the same or similar features will be omitted.

A gap GP is provided adjacent to or in the vicinity of the bonding portion BP3. In a case in which conductive paste is used, an intermetallic compound is provided, so that peeling and cracking may occur in the bonding portion BP3 as with the bonding portion BP4. Consequently, the gap GP is able to significantly reduce or prevent peeling or cracking of the conductor pattern 210 and the interlayer connection conductor 300B in the bonding portion BP3. However, the bonding portion BP3, since having a larger bonding area than the bonding portion BP 4 shown in FIG. 5, is difficult to be peeled or cracked. Therefore, the gap GP corresponding to the bonding portion BP3 may be omitted according to specifications or other factors.

Third Preferred Embodiment

A resin substrate according to a third preferred embodiment of the present invention will be described with reference to the drawings. The third preferred embodiment corresponds to a case in which an interlayer connection conductor is formed by conductive paste, for example.

Figure 9:
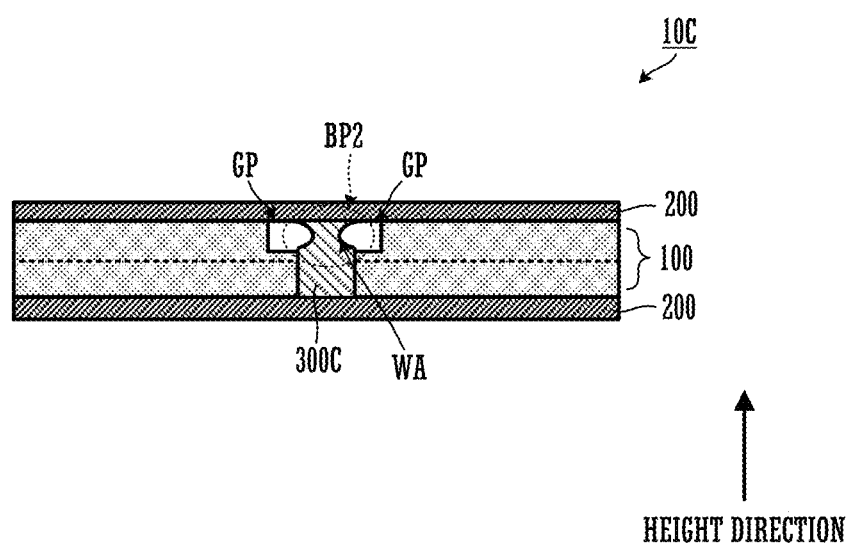
FIG. 9 is a side cross-sectional view of a configuration of a resin substrate 10C according to a third preferred embodiment of the present invention.

FIG. 9 is a side cross-sectional view of a configuration of a resin substrate 10C according to the third preferred embodiment of the present invention. The third preferred embodiment describes a case of the shape of the pattern 2 shown in FIG. 1B.

As shown in FIG. 9, the resin substrate 10C according to the third preferred embodiment is different from the resin substrate 10 according to the first preferred embodiment in that an interlayer connection conductor 300C including a constricted portion WA is provided. Other basic features of the resin substrate 10C are the same as or similar to the basic features of the resin substrate 10, and a description of the same or similar features will be omitted.

When conductive paste is used for an interlayer connection conductor, the bonding portion BP2 of the conductor pattern 210 and the interlayer connection conductor 300C may include a constricted portion WA of which the diameter is smaller than other portions of the interlayer connection conductor 300C. In a case of such a structure, the constricted portion WA is lower in strength than the other portions.

Without a gap GP, when an external force is applied to the constricted portion WA with low strength, peeling or cracking of the conductor pattern 210 and the interlayer connection conductor 300C may easily occur at the constricted portion WA as a starting point.

With this configuration, a gap GP is provided so as to surround the constricted portion WA of the interlayer connection conductor 300C, which makes it possible to significantly reduce or prevent stress to the constricted portion WA with low strength. In other words, peeling or cracking of the interlayer connection conductor 300C in the bonding portion BP2 is able to be significantly reduced or prevented.

Fourth Preferred Embodiment

A resin substrate according to a fourth preferred embodiment of the present invention will be described with reference to the drawings. The fourth preferred embodiment corresponds to a case in which an interlayer connection conductor is formed by a metal body (a metal rod), for example.

Figure 10:
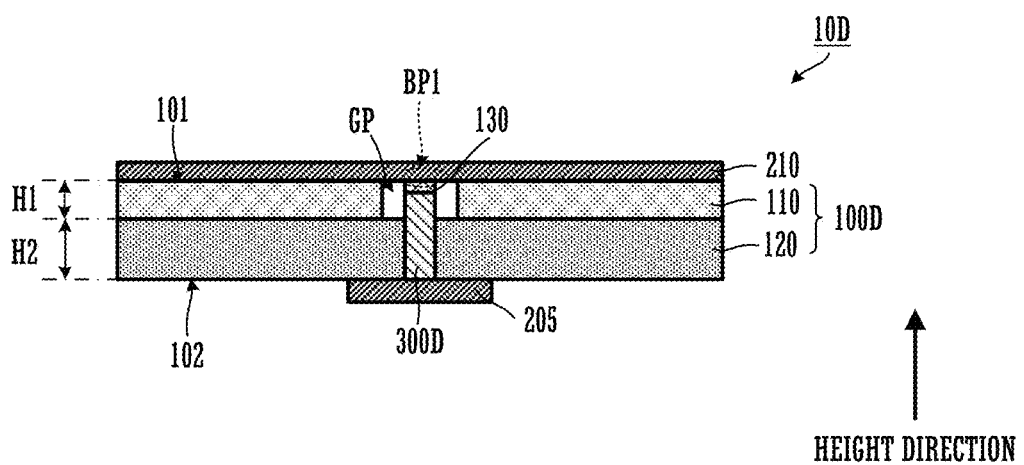
FIG. 10 is a side cross-sectional view of a configuration of a resin substrate 10D according to a fourth preferred embodiment of the present invention.

FIG. 10 is a side cross-sectional view of a configuration of a resin substrate 10D according to the fourth preferred embodiment of the present invention. FIG. 11 is a flow chart of a non-limiting example of a method of manufacturing the resin substrate 10D according to the fourth preferred embodiment of the present invention. FIGS. 12A to 12E are side cross-sectional views of the method of manufacturing the resin substrate 10D according to the fourth preferred embodiment of the present invention. The fourth preferred embodiment describes the case of the shape of the pattern 1 shown in FIG. 1A.

As shown in FIG. 10, the resin substrate 10D according to the fourth preferred embodiment is different from the resin substrate 10A according to the second preferred embodiment in that an interlayer connection conductor 300D is bonded to a conductor pattern 210 through a bonding layer 130 and in that the relationship between the thicknesses of a first resin layer 110 and a second resin layer 120 is defined. Other basic features of the resin substrate 10D are the same as or similar to the basic features of the resin substrate 10A, and a description of the same or similar features will be omitted.

Structure of Resin Substrate

As shown in FIG. 10, the resin substrate 10D includes a resin body 100D, a terminal electrode 205, a conductor pattern 210, and an interlayer connection conductor 300D. The interlayer connection conductor 300D includes a rod-shaped (pillar-shaped) metal pin, and is preferably made of Cu, for example.

The resin body 100D includes a first resin layer 110 and a second resin layer 120. The resin body 100D includes a first main surface 101 and a second main surface 102.

The interlayer connection conductor 300D and the conductor pattern 210 are bonded to each other through a bonding layer 130. The bonding layer 130 is a conductive bonding layer, and is a bonding material such as solder, for example. The bonding portion BP1 is defined by the conductor pattern 210, the interlayer connection conductor 300D, and the bonding layer 130. The bonding layer 130 is preferably made of, for example, a material including Sn, which easily forms a layer with low strength.

A gap GP is provided adjacent to or in the vicinity of the bonding portion BP1, that is, in the first resin layer 110 being the first main surface 101 of the resin body 100D. More specifically, the gap GP is provided, in the resin body 100D, adjacent to or in the vicinity of the bonding portion BP1 in which the interlayer connection conductor 300D and the conductor pattern 200 are bonded to each other.

Without the gap GP, external stress is concentrated on the bonding portion BP1 of the conductor pattern 210 and the interlayer connection conductor 300D. The bonding layer 130 is formed by mixing a resin in order to control fluidity. As a result, the metallic density of the bonding layer 130 is reduced. Consequently, in the case in which stress is concentrated on the bonding portion BP1, peeling or cracking of the conductor pattern 210 and the interlayer connection conductor 300D may easily occur at the bonding portion BP1 as a starting point.

With this configuration, the gap GP is provided adjacent to or in the vicinity of the bonding portion BP1 of the interlayer connection conductor 300D and the conductor pattern 210, which makes it possible to significantly reduce or prevent the stress concentrated on the bonding portion BP1. In other words, peeling of the interlayer connection conductor 300D and the conductor pattern 210 is able to be significantly reduced or prevented.

Further, the thicknesses of the first resin layer 110 and the second resin layer 120 more preferably satisfies the relationship shown below. The first resin layer 110 and the second resin layer 120 are provided so that the thickness H1 of the first resin layer 110 and the thickness H2 of the second resin layer 120 may satisfy H1<H2.

With such a configuration, a second area in which the second resin layer 120 is in contact with the interlayer connection conductor 300D is able to be increased. In other words, the external stress exerted on the resin substrate 10D is further easily distributed on a surface on which the second resin layer 120 contacts the interlayer connection conductor 300D. As a result, occurrence of peeling or cracking of the bonding portion BP1 and occurrence of cracking to the interlayer connection conductor 300D are able to be significantly reduced or prevented.

Method of Manufacturing Resin Substrate

Hereinafter, a non-limiting example of a method of manufacturing the resin substrate 10D will be described. FIG. 11 is a flow chart of a method of manufacturing the resin substrate 10D. FIGS. 12A to 12E are cross-sectional views of a shape in a main step in the method of manufacturing the resin substrate 10D.

Figure 12A:
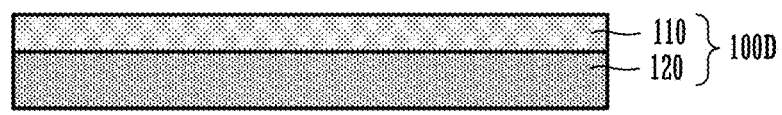
FIGS. 12A to 12E are side cross-sectional views of the method of manufacturing the resin substrate 10D according to the fourth preferred embodiment of the present invention.

As shown in FIG. 11 and FIG. 12A, a first resin layer 110 and a second resin layer 120 are prepared. Next, the first resin layer 110 and the second resin layer 120 are stacked to form a resin body 100D (S301).

Figure 12B:
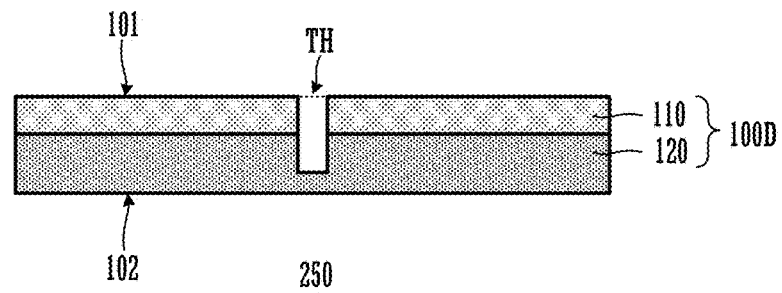

As shown in FIG. 11 and FIG. 12B, a hole TH extending from a first main surface 101 of the resin body 100D toward a second main surface 102 of the resin body 100D is formed by a drill or another suitable device (S302), for example. At this time, the hole TH is formed so as not to reach the second main surface 102. In other words, the hole TH is formed so as not to penetrate the second resin layer 120.

Figure 12C:
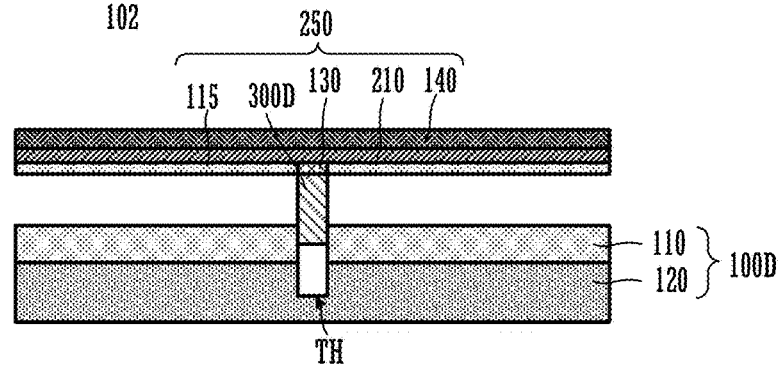

As shown in FIG. 11, and FIG. 12C, the resin body 100D is combined with a component 250 (S303). The component 250 is defined by an auxiliary resin layer 115, the bonding layer 130, a release sheet 140, a conductor pattern 210, and the interlayer connection conductor 300D. The release sheet 140 may be a resist, a cover lay, or a resin base material.

The specific configuration and schematic manufacturing method of the component 250 are as follows. The conductor pattern 210 is attached to the release sheet 140. The auxiliary resin layer 115 is provided so as to come into contact with a surface of the conductor pattern 210 opposite to a surface of the conductor pattern 210 in contact with the release sheet 140. In other words, the release sheet 140, the conductor pattern 210, and the auxiliary resin layer 115 are stacked in this order. In a predetermined position of the auxiliary resin layer 115, a portion of the auxiliary resin layer 115 is removed. The portion in which the auxiliary resin layer 115 is removed is bonded to a rod-shaped metal body (a metal pin) through the bonding layer 130. The metal body provides the interlayer connection conductor 300D.

It is to be noted that the first resin layer 110 and the auxiliary resin layer 115 are made of the same material. The bonding layer 130 is a conductive adhesive, and is preferably solder, for example. The conductor pattern 210 is preferably a Cu foil, for example. The main component of the metal body (the metal pin) is preferably Cu, for example. The release sheet 140 is preferably made of polyethylene terephthalate, polyethylene naphthalate, or the like, for example. The first resin layer 110 and the auxiliary resin layer 115 are made of the same material, so that, in the configuration in which the first resin layer 110 and the auxiliary resin layer 115 are bonded to each other, the adhesion strength is able to be increased, as compared with a case in which different materials are used for adhesion.

Figure 12D:
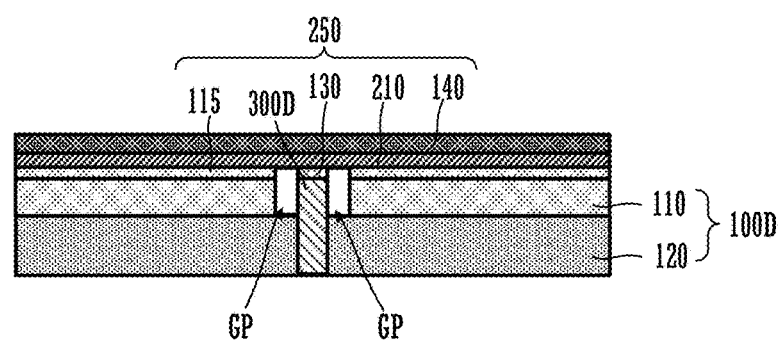

As shown in FIG. 11 and FIG. 12D, the component 250 is fitted in the resin body 100D, and heated and pressed (thermally pressed) (S304). At this time, the interlayer connection conductor 300D is inserted so as to fit in the hole TH. The temperature at the time of heating and pressing (thermal pressing) is preferably about 300° C., for example. In such a case, the thermal expansion coefficient of the first resin layer 110 is greater than the thermal expansion coefficient of the second resin layer 120, so that so that a gap GP is formed between the first resin layer 110 and the interlayer connection conductor 300D due to the difference in the thermal expansion coefficients of the first resin layer 110 and the second resin layer 120.

As shown in FIG. 11 and FIG. 12D, the release sheet 140 is removed (S305). In addition, the second resin layer 120 is ground by a router or another suitable device, for example, from a surface of the second resin layer 120 opposite to a surface of the second resin layer 120 that is fitted in the component 250, so as to expose the interlayer connection conductor 300D, which causes the interlayer connection conductor (the metal body) 300D to be exposed (S306). Such a configuration is able to smooth the surface of the second resin layer 120 and the interlayer connection conductor 300D. It is to be noted that the release sheet 140, in a case of being a resist, a cover lay, an adhesive, a resin base material, or the like, for example, does not need to be removed, and a step of separately forming a protective film is able to be omitted, and simplified.

Figure 12E:
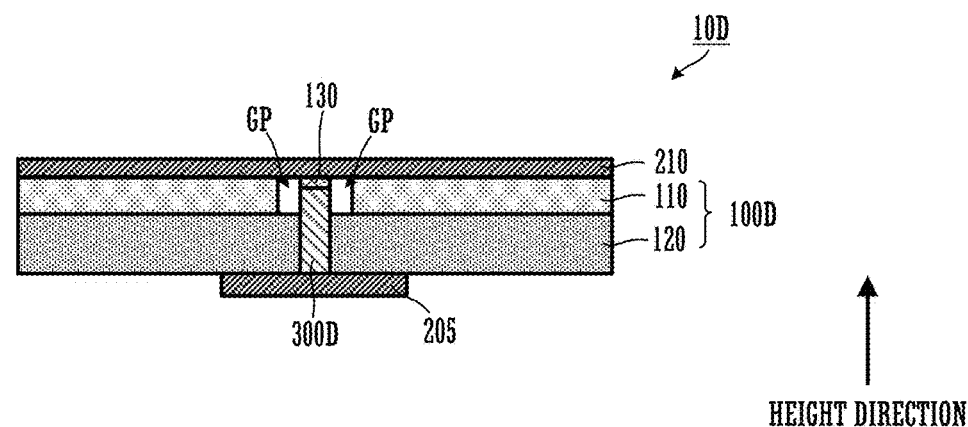

As shown in FIG. 11 and FIG. 12E, plating processing is performed so as to include an exposed surface of the interlayer connection conductor 300D, which forms the terminal electrode 205 (S307). It is to be noted that the terminal electrode 205 made of metal foil (such as a Cu foil, for example) may be attached to the surface of the interlayer connection conductor 300D by using a conductive adhesive or conductive paste.

The use of such a manufacturing method makes it possible to reliably and highly accurately achieve a configuration such as the above-described resin substrate 10D. In addition, as shown in Step S304, a gap GP is able to be formed by fitting the component 250 in a stacked body and performing a step of heating and pressing. Such a configuration is able to simplify the step of forming the resin substrate 10D. The step of forming the component 250 may be performed before Steps S301 and S302.

Modification of Fourth Preferred Embodiment

A resin substrate according to a modification of the fourth preferred embodiment of the present invention will be described with reference to the drawings. FIG. 13 is a side cross-sectional view of a configuration of a resin substrate 10E according to a modification of the fourth preferred embodiment of the present invention. FIG. 14 is a flow chart of a non-limiting example of a method of manufacturing the resin substrate 10E according to the modification of the fourth preferred embodiment of the present invention. FIGS. 15A to 15E are side cross-sectional views of the method of manufacturing the resin substrate 10E according to the modification of the fourth preferred embodiment of the present invention. The modification of the fourth preferred embodiment describes the case of the shape of the pattern 1 shown in FIG. 1A.

As shown in FIG. 13, the resin substrate 10E according to the modification of the fourth preferred embodiment is different from the resin substrate 10D according to the fourth preferred embodiment in that a resin body 100D includes only second resin layers 120. Other basic features of the resin substrate 10E are the same as or similar to the basic features of the resin substrate 10D, and a description of the same or similar features will be omitted.

Structure of Resin Substrate

As shown in FIG. 13, the resin substrate 10E includes a resin body 100E, a bonding layer 130, a terminal electrode 205, a conductor pattern 210, and an interlayer connection conductor 300E. The interlayer connection conductor 300E and the conductor pattern 210 are bonded to each other through the bonding layer 130. The resin body 100E includes a plurality of second resin layers 120. The interlayer connection conductor 300E is the same or substantially the same as the interlayer connection conductor 300D.

A bonding portion BP1 is provided in a portion in which the conductor pattern 210 and the interlayer connection conductor 300E are bonded to each other. In addition, a gap GP is provided adjacent to or in the vicinity of the bonding portion BP1, that is, adjacent to or in the vicinity of the first main surface 101 of the resin body 100E.

Without the gap GP, external stress is concentrated on the bonding portion BP1 of the conductor pattern 210 and the interlayer connection conductor 300E. Consequently, peeling or cracking of the conductor pattern 210 and the interlayer connection conductor 300E may easily occur at the bonding portion BP1 as a starting point.

With this configuration, the gap GP is provided adjacent to or in the vicinity of the bonding portion BP1 of the interlayer connection conductor 300E and the conductor pattern 210, which makes it possible to significantly reduce or prevent the stress concentrated on the bonding portion BP1. In other words, occurrence of peeling or cracking of the interlayer connection conductor 300E and the conductor pattern 210 at the bonding portion BP1, and occurrence of cracking of the interlayer connection conductor 300E at the bonding portion BP1 are able to be significantly reduced or prevented.

Method of Manufacturing Resin Substrate

Hereinafter, a non-limiting example of a method of manufacturing the resin substrate 10E will be described. FIG. 14 is a flow chart of a method of manufacturing the resin substrate 10E. FIGS. 15A to 15E are cross-sectional views of a shape in a main step in the method of manufacturing the resin substrate 10E.

Figure 15A:
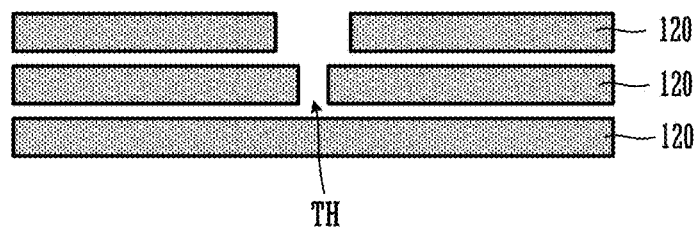
FIGS. 15A to 15E are side cross-sectional views of the method of manufacturing the resin substrate 10E according to the modification of the fourth preferred embodiment of the present invention.

As shown in FIG. 14 and FIG. 15A, a plurality of second resin layers 120 are prepared, and a hole TH is formed in a prescribed position of the second resin layers 120 (S311). In such a case, a gap GP is able to be formed by forming a hole TH of the second resin layer 120 on a side in which a component 250 to be described later is fitted so as to be larger than other holes TH. In other words, the size of the gap GP is able to be adjusted by the size of the hole TH of the second resin layer 120 on the side in which the component 250 is fitted.

Figure 15B:
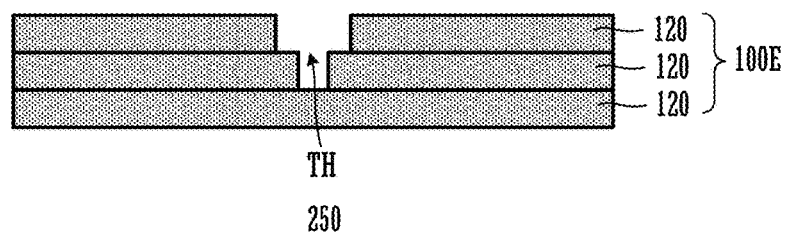

As shown in FIG. 14 and FIG. 15B, the second resin layers 120 are stacked by a build-up method to form the resin body 100E (S312). It is to be noted that the use of the build-up method makes it possible to significantly reduce or prevent misalignment (misalignment of the hole TH) of each layer at the time of stacking the second resin layers 120.

Figure 15C:
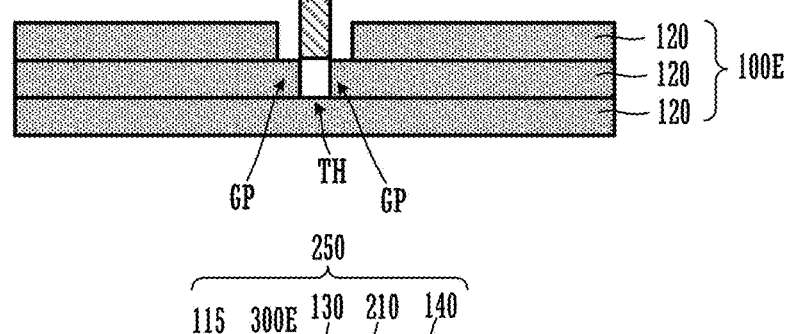

As shown in FIG. 14, and FIG. 15C, the resin body 100E is combined with the component 250 (S313).

Figure 15D:
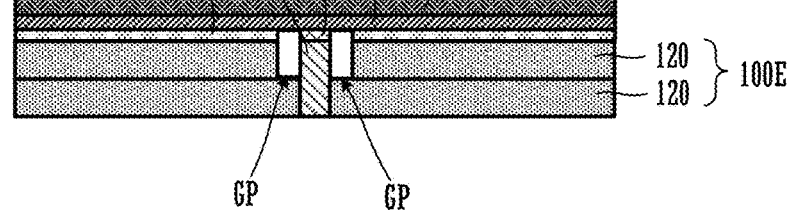

As shown in FIG. 14 and FIG. 15D, the component 250 is fitted in the resin body 100E, and heated and pressed (thermally pressed) (S314). At this time, the interlayer connection conductor (the metal body) 300 is inserted so as to fit in the hole TH.

The resin body 100E is ground by a router or another suitable device, for example, from a surface of the resin body 100E opposite to a surface of the resin body 100E on which the component 250 is provided, so as to expose the interlayer connection conductor (a metal body) 300E (S315).

Figure 15E:
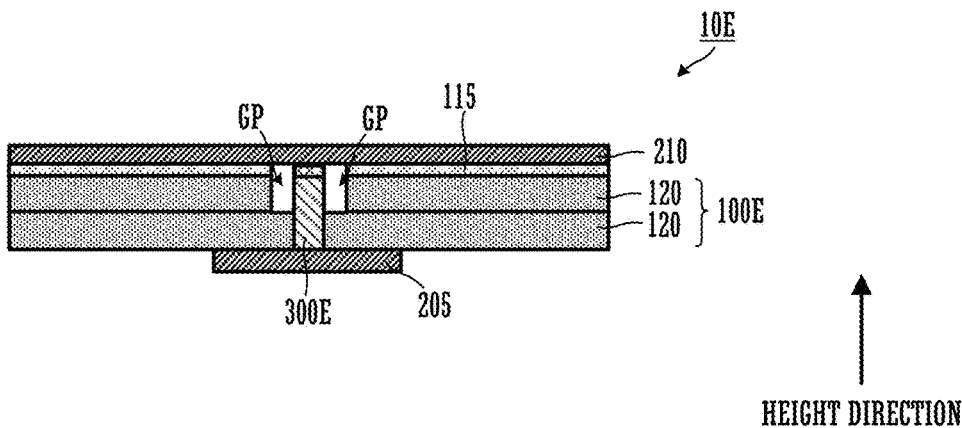

As shown in FIG. 14 and FIG. 15E, the release sheet 140 is removed (S316). The terminal electrode 205 is formed by plating or the like, for example, on the surface of the resin body 100E to which the interlayer connection conductor 300E is exposed (S317). It is to be noted that the release sheet 140, in a case of being a resist, a cover lay, an adhesive agent, a resin base material, or the like, for example, does not need to be removed, and a step of separately forming a protective film is able to be omitted, and simplified.

The use of such a manufacturing method makes it possible to reliably and highly accurately achieve a configuration such as the above-described resin substrate 10E. In addition, the gap GP is able to be reliably formed by the step of forming the hole TH of the second resin layer 120 in contact with the component 250 so as to be larger than the other holes TH, as shown in step S311. The step of forming the component 250 may be performed before Steps S311 and S312.

It is to be noted that the auxiliary resin layer 115 is preferably the same as the first resin layer 110.

In the portion in which the auxiliary resin layer 115 and the interlayer connection conductor 300E are in contact with each other, in the above-described configuration, the hole TH formed in Step S311, is preferably formed in such a size that the gap GP is able to be formed even when a flow occurs in the auxiliary resin layer 115. In the portion of the hole TH that is not in contact with the auxiliary resin layer 115, the hole TH may have such a size that the interlayer connection conductor 300E is able to be inserted. A flow also occurs in the second resin layer 120. In other words, the hole TH in the second resin layer 120 may be formed according to the amount of flow of the second resin layer 120.

In addition, in the above-described configuration, the thickness of the auxiliary resin layer 115 is preferably smaller than the thickness of the second resin layer 120. In such a case, even when the auxiliary resin layer 115 is in contact with the interlayer connection conductor 300E, it is difficult to prevent a reduction in the stress at the bonding portion BP1 of the conductor pattern 210 and the interlayer connection conductor 300E, the reduction being caused by the formation of the gap GP.

It is to be noted that, while the above-described configuration provides an example in which the resin substrate 10E is formed by the build-up method, a similar resin substrate 10E is able to be obtained also by collectively stacking the second resin layers 120.

In addition, while the above-described configuration provides an example in which the resin body 100E is formed by using the second resin layer 120, the resin body 100E may be formed by using the first resin layer 110. However, in a case in which the first resin layer 110 is used, a hole TH having a sufficient size such that the gap GP is able to be formed may be formed.

Fifth Preferred Embodiment

A resin substrate according to a fifth preferred embodiment of the present invention will be described with reference to the drawings. The fifth preferred embodiment corresponds to a case in which an interlayer connection conductor is formed by plating, for example.

Figure 16:
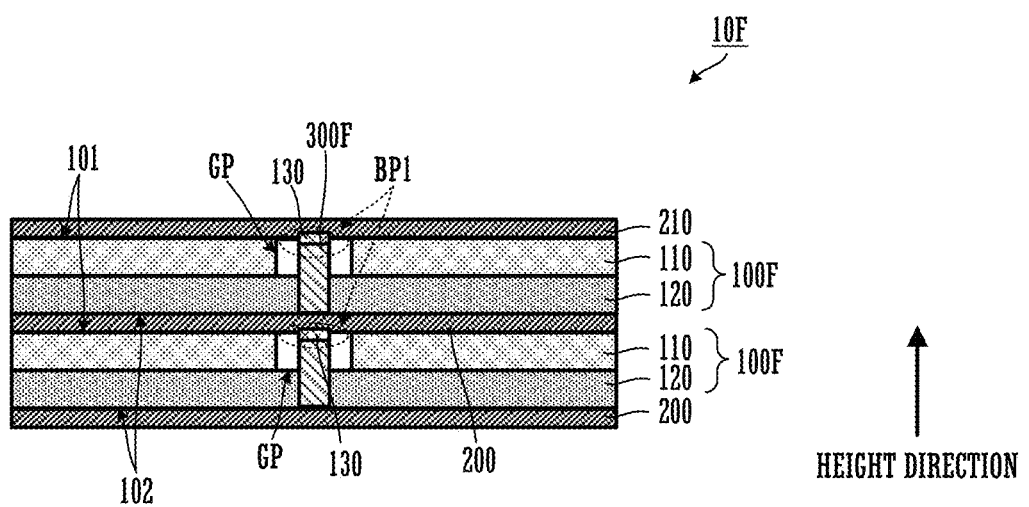
FIG. 16 is a side cross-sectional view of a configuration of a resin substrate 10F according to a fifth preferred embodiment of the present invention.

FIG. 16 is a side cross-sectional view of a configuration of a resin substrate 10F according to the fifth preferred embodiment of the present invention. FIG. 17 is a flow chart of a non-limiting example of a method of manufacturing the resin substrate 10F according to the fifth preferred embodiment of the present invention. FIGS. 18A to 18E are side cross-sectional views of the method of manufacturing the resin substrate 10F according to the fifth preferred embodiment of the present invention. The fifth preferred embodiment corresponds to the case of the pattern 1 shown in FIG. 1A.

As shown in FIG. 16, the resin substrate 10F according to the fifth preferred embodiment is different from the resin substrate 10A according to the second preferred embodiment in that a structure in which a plurality of resin bodies 100F are stacked on each other is provided and in that an interlayer connection conductor 300F is bonded to a conductor pattern 210 through a bonding layer 130. Other basic features of the resin substrate 10F are the same as or similar to the basic features of the resin substrate 10A, and a description of the same or similar features will be omitted.

Structure of Resin Substrate

As shown in FIG. 16, the resin substrate 10F includes a plurality of resin bodies 100F, a plurality of conductor patterns 200 and 210, and a plurality of interlayer connection conductors 300F. The first main surface 101 of a resin body 100F is a surface of the first resin layer 110 opposite to a surface in contact with the second resin layer 120, and the second main surface 102 of the resin body 100F is a surface of the second resin layer 120 opposite to a surface in contact with the first resin layer 110. While FIG. 16 shows a configuration in which the resin bodies 100F are provided in two layers, the resin bodies 100F may be stacked in three or more layers.

In such a case, the resin substrate 10F includes the plurality of resin bodies 100F in which the second resin layer 120, the first resin layer 110, the second resin layer 120, and the first resin layer 110 are stacked in this order in the height direction. In other words, the first main surface 101 and the second main surface 102 of adjacent resin bodies 100F are provided so as to come into contact with each other through the conductor pattern 200.

A bonding portion BP1 is provided in a portion in which the conductor pattern 200 and the interlayer connection conductor 300F of the adjacent resin bodies 100F are bonded to each other. The bonding portion BP1 is defined by a bonding layer 130 using solder or the like, for example. The bonding portion BP1 may be formed by conductive paste or plating, for example. A gap GP is provided adjacent to or in the vicinity of the bonding portion BP1, that is, in the first resin layer 110 being the first main surface 101 of the resin body 100F.

Without the gap GP, external stress is concentrated on the bonding portion BP1 of the conductor patterns 200 and 210 and the interlayer connection conductor 300F. Consequently, peeling or cracking of the conductor pattern 200 and the interlayer connection conductor 300F may easily occur at the bonding portion BP1 as a starting point.

Even with this configuration, the gap GP is provided adjacent to or in the vicinity of the bonding portion BP1 of the interlayer connection conductor 300F and the conductor patterns 200 and 210, which makes it possible to significantly reduce or prevent the stress concentrated on the bonding portion BP1. In other words, peeling of the interlayer connection conductor 300F and the conductor patterns 200 and 210 is able to be significantly reduced or prevented.

Method of Manufacturing Resin Substrate

Hereinafter, a non-limiting example of a method of manufacturing the resin substrate 10F will be described. FIG. 17 is a flow chart of a method of manufacturing the resin substrate 10F. FIGS. 18A to 18E are cross-sectional views of a shape in a main step in the method of manufacturing the resin substrate 10F.

Figure 18A:
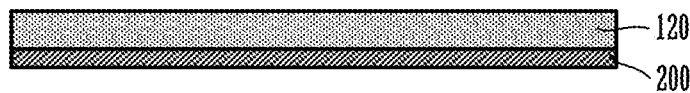
FIGS. 18A to 18E are side cross-sectional views of the method of manufacturing the resin substrate 10F according to the fifth preferred embodiment of the present invention.

As shown in FIG. 17 and FIG. 18A, a second resin layer 120 is formed on a conductor pattern 200 by a cast method (S401).

Figure 18B:
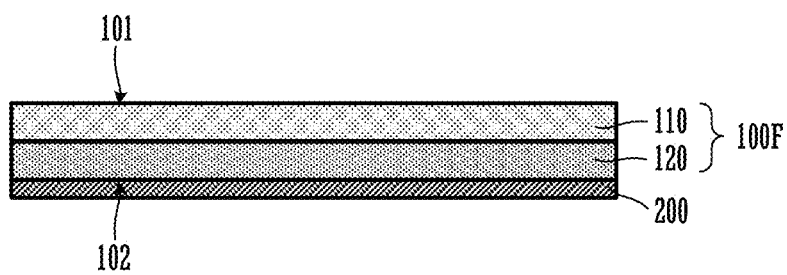
Figure 18C:
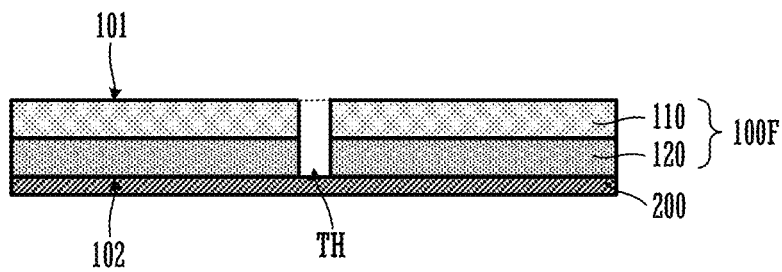

As shown in FIG. 17 and FIG. 18B, a first resin layer 110 is stacked on the second resin layer 120 (S402). In other words, the conductor pattern 200, the second resin layer 120, and the first resin layer 110 are stacked in this order in a height direction. As shown in FIG. 17 and FIG. 18C, a hole TH is formed in the first resin layer 110 and the second resin layer 120 by a laser (S403). It is to be noted that the hole TH is formed so as to penetrate the resin body 100F.

Figure 18D:
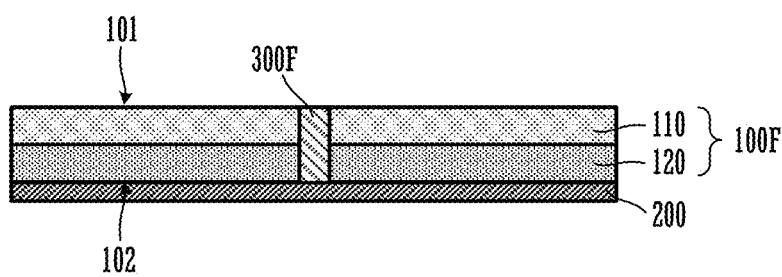

As shown in FIG. 17 and FIG. 18D, plating is formed in the hole TH (S404). The plating provides the interlayer connection conductor 300F.

Figure 18E:
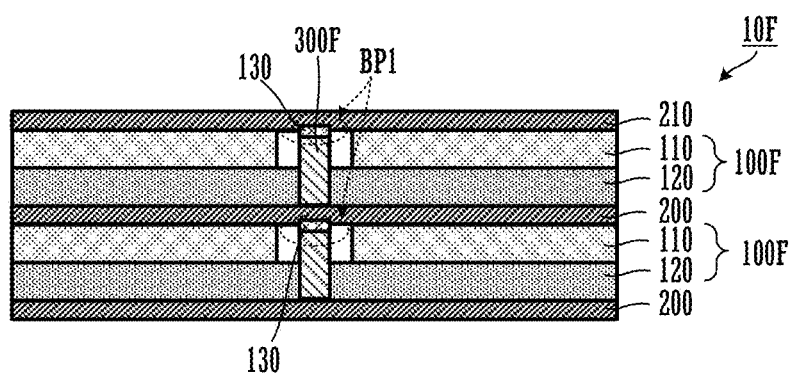

As shown in FIG. 17 and FIG. 18E, a plurality of structures formed in S404 are stacked on each other. In such a case, solder paste is applied between the conductor pattern 200 and the interlayer connection conductor 300, in the adjacent resin bodies 100F. The conductor pattern 210 is formed on the surface (the surface on the side on which the conductor pattern 200 is not formed) of the stacked resin bodies 100F, and the entirety is heated and pressed (S405). The temperature at the time of the heating and pressing is preferably about 300° C., for example.

It is to be noted that the heating and pressing is performed, so that the solder paste between the conductor pattern 200 and the interlayer connection conductor 300 is hardened, and thus a bonding layer 130 is formed. The resin body 100F is heated and then cooled, so that a gap GP is formed between the first resin layer 110 and the interlayer connection conductor 300 due to the difference in the thermal expansion coefficients of the first resin layer 110 and the second resin layer 120.

The use of such a manufacturing method makes it possible to reliably and highly accurately achieve a configuration such as the above-described resin substrate 10F.

Sixth Preferred Embodiment

A resin substrate according to a sixth preferred embodiment of the present invention will be described with reference to the drawings. FIG. 19 is a side cross-sectional view of a configuration of a resin substrate 10G according to the sixth preferred embodiment of the present invention. The sixth preferred embodiment describes the case of the shape of the pattern 1 shown in FIG. 1A.

As shown in FIG. 19, the resin substrate 10G according to the sixth preferred embodiment is different from the resin substrate 10F according to the fifth preferred embodiment in that a bonding layer 150 is provided, in the stacking order when a plurality of resin bodies 100G are stacked, and in that an interlayer connection conductor 300G2 is provided in a position that is not overlapped with the position of the interlayer connection conductor 300G in a plan view. Other basic features of the resin substrate 10G are the same as or similar to the basic features of the resin substrate 10F, and a description of the same or similar features will be omitted. While FIG. 19 shows a configuration in which the resin bodies 100G are provided in three layers, the resin bodies 100G may be stacked in four or more layers.

Structure of Resin Substrate

As shown in FIG. 19, the resin substrate 10G includes a plurality of resin bodies 100G, a plurality of conductor patterns 200, and a plurality of interlayer connection conductors 300G. In addition, an interlayer connection conductor 300G2 is provided in a position that is not overlapped with the interlayer connection conductors 300G in a plan view.

In such a case, the resin substrate 10G includes the plurality of resin bodies 100G in which the first resin layer 110, the second resin layer 120, the first resin layer 110, the second resin layer 120, the second resin layer 120, and the first resin layer 110 are stacked in this order in the height direction. In other words, second main surfaces 102 of the resin bodies 100G are provided so as to come into contact with each other. In the resin body 100G with which the second main surface 102 of the resin body 100G is in contact, in the height direction of the resin substrate 10G, the resin body 100G on a lower side corresponds to a "first resin body", and the resin body 100G on an upper side corresponds to a "second resin body".

More specifically, the second resin layers 120 of the plurality of resin bodies 100G are in contact with each other. On such a contact surface, the interlayer connection conductors 300G are bonded to each other through a bonding layer 130. Solder or conductive paste, for example, is preferably used for the bonding layer 130.

Even with this configuration, the gap GP is provided adjacent to or in the vicinity of the bonding portion BP1 of the interlayer connection conductors 300G and 300G2 and the conductor patterns 200, which makes it possible to significantly reduce or prevent the stress to the bonding portion BP1. In other words, the occurrence of peeling or cracking of the interlayer connection conductors 300G and 300G2 and the conductor patterns 200 is able to be significantly reduced or prevented.

In addition, in this configuration, the interlayer connection conductors 300G are bonded to each other through a bonding layer 150 on the contact surface of the second resin layers 120. The second resin layer 120 has a small thermal expansion coefficient. Consequently, deformation due to heat is difficult to occur and the stress to the bonding layer 150 is difficult to occur. The interlayer connection conductors 300G to be bonded have almost no difference in an end area, and are bonded to each other over the entire or substantially the entire end area. Accordingly, breakage in the bonding layer 150 is significantly reduced or prevented. Solder or conductive paste, for example, is preferably used for the bonding layer 150.

The gap GP is provided on a side of a surface layer that easily receives the stress of the resin substrate 10G, which makes it possible to significantly reduce or prevent the occurrence of cracking at the bonding portion BP1. It is to be noted that cracking is difficult to occur in the bonding layer 150 provided on an inner layer of the resin substrate 10G since the second resin layer 120 and the first resin layer 110 reduce stress from the outside. Consequently, it is also possible to omit the gap GP to the bonding layer 150. However, the gap GP may be provided also adjacent to or in the vicinity of the bonding layer 150.

Further, the interlayer connection conductor 300G and the interlayer connection conductor 300G2 are provided in positions that are not overlapped with each other in a plan view, which is applicable to circuits of various patterns.

Seventh Preferred Embodiment

Figure 20:
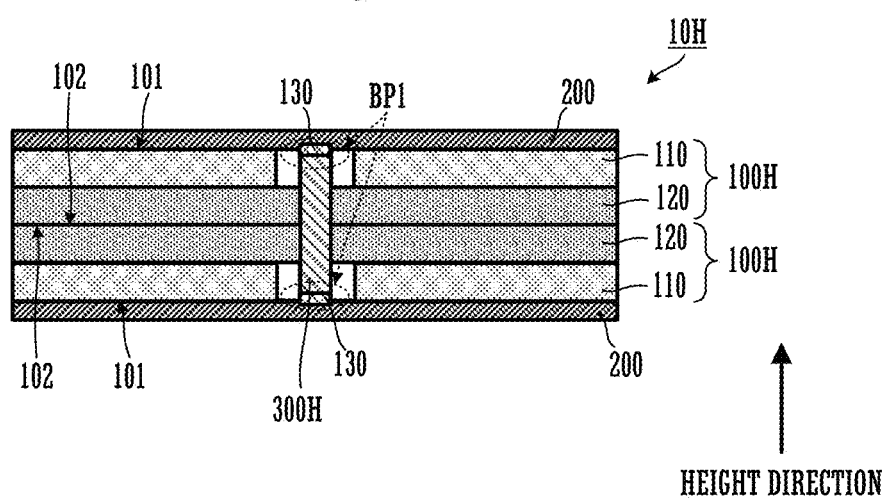
FIG. 20 is a side cross-sectional view of a configuration of a resin substrate 10H according to a seventh preferred embodiment of the present invention.

A resin substrate according to a seventh preferred embodiment of the present invention will be described with reference to the drawings. FIG. 20 is a side cross-sectional view of a configuration of a resin substrate 10H according to the seventh preferred embodiment of the present invention. The seventh preferred embodiment corresponds to a case in which an interlayer connection conductor includes a metal body (a metal rod), for example, and describes the case of the shape of the pattern 1 shown in FIG. 1A.

As shown in FIG. 20, the resin substrate 10H according to the seventh preferred embodiment is different from the resin substrate 10F according to the fifth preferred embodiment in the stacking order when a plurality of resin bodies 100H are stacked and in an interlayer connection conductor 300H provided so as to penetrate the plurality of resin bodies 100H. Other basic features of the resin substrate 10H are the same as or similar to the basic features of the resin substrate 10F, and a description of the same or similar features will be omitted. While FIG. 20 shows a configuration in which the resin bodies 100H are provided in two layers, the resin bodies 100H may be stacked in three or more layers.

Structure of Resin Substrate

As shown in FIG. 20, the resin substrate 10H includes a plurality of resin bodies 100H, a plurality of conductor patterns 200, and an interlayer connection conductor 300H.

In such a case, the resin substrate 10H includes the plurality of resin bodies 100H in which the first resin layer 110, the second resin layer 120, the second resin layer 120, and the first resin layer 110 are stacked in this order in the height direction. In other words, second main surfaces 102 of the resin bodies 100H are provided so as to come into contact with each other. In the height direction of the resin substrate 10H, the resin body 100H on a lower side corresponds to a "first resin body", and the resin body 100H on an upper side corresponds to a "second resin body".

More specifically, the second resin layers 120 of the plurality of resin bodies 100H are in contact with each other. The interlayer connection conductor 300H is provided so as to penetrate the plurality of resin bodies 100H. The interlayer connection conductor 300H and a conductor pattern 200 are bonded to each other through a bonding layer 130. The bonding layer 130 is a conductive bonding layer, and is preferably a bonding material such as solder, for example.

Even with this configuration, the gap GP is provided adjacent to or in the vicinity of the bonding portion BP1 of the interlayer connection conductor 300H and the conductor pattern 200, which makes it possible to significantly reduce or prevent the stress to the bonding portion BP1. In other words, the occurrence of peeling or cracking of the interlayer connection conductor 300H and the conductor pattern 200 is able to be significantly reduced or prevented.

Eighth Preferred Embodiment

Figure 21:
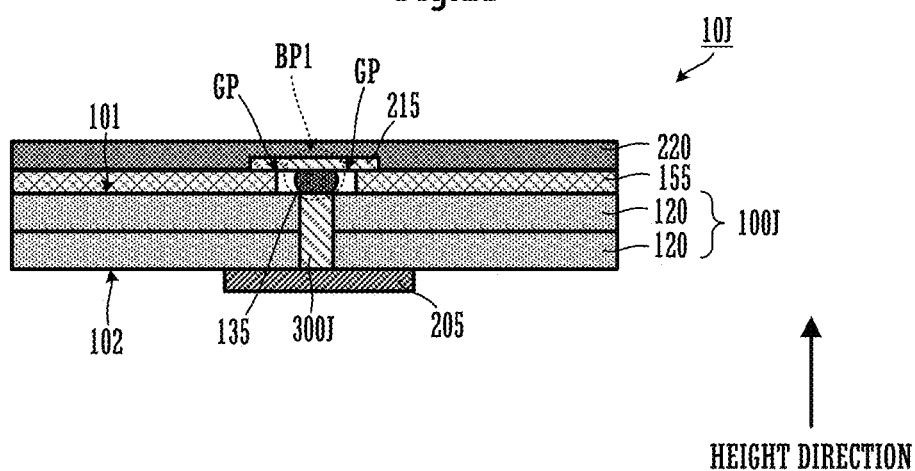
FIG. 21 is a side cross-sectional view of a configuration of a resin substrate 10J according to an eighth preferred embodiment of the present invention.

A resin substrate according to an eighth preferred embodiment of the present invention will be described with reference to the drawings. FIG. 21 is a side cross-sectional view of a configuration of a resin substrate 10J according to the eighth preferred embodiment of the present invention. FIG. 22 is a flow chart of a non-limiting example of a method of manufacturing the resin substrate 10J according to the eighth preferred embodiment of the present invention. FIGS. 23A to 23E are side cross-sectional views of the method of manufacturing the resin substrate 10J according to the eighth preferred embodiment of the present invention. The eighth preferred embodiment corresponds to a case in which an interlayer connection conductor includes a metal body (a metal rod), for example, and describes the case of the shape of the pattern 1 shown in FIG. 1A.

As shown in FIG. 21, the resin substrate 10J according to the eighth preferred embodiment is different from the resin substrate 10E according to the fourth preferred embodiment in that a resin layer 220, an adhesive layer 155, and an electrode 215 are provided, in that an interlayer connection conductor 300J and the electrode 215 are connected to each other through solder 135, and in that the adhesive layer 155 defines a gap GP. Other basic features of the resin substrate 10J are the same as or similar to the basic features of the resin substrate 10E, and a description of the same or similar features will be omitted.

Structure of Resin Substrate

As shown in FIG. 21, the resin substrate 10J includes a resin body 100J, an adhesive layer 155, a resin layer 220, an electrode 215, and an interlayer connection conductor 300J. The interlayer connection conductor 300J and the electrode 215 are bonded to each other through solder 135. The resin body 100J includes a plurality of second resin layers 120. The interlayer connection conductor 300J is the same or substantially the same as the interlayer connection conductor 300E. It is to be noted that the thickness of the adhesive layer 155 is shown in an exaggerated manner and may be structured to be even thinner.

A bonding portion BP1 is provided in a portion in which the electrode 215 and the interlayer connection conductor 300J are bonded to each other. In addition, a gap GP is provided adjacent to or in the vicinity of the bonding portion BP1, that is, adjacent to or in the vicinity of the first main surface 101 of the resin body 100J. The gap GP is provided in the adhesive layer 155. It is to be noted that the adhesive layer 155 may preferably be made of a polyimide type resin, LCP, or a fluororesin, for example.

Without the gap GP, external stress is concentrated on the bonding portion BP1 of the electrode 215 and the interlayer connection conductor 300J. Consequently, peeling or cracking of the electrode 215 and the interlayer connection conductor 300J may easily occur at the bonding portion BP1 as a starting point.

With this configuration, the gap GP is provided adjacent to or in the vicinity of the bonding portion BP1 of the interlayer connection conductor 300J and the electrode 215, which makes it possible to significantly reduce or prevent the stress concentrated on the bonding portion BP1. In other words, occurrence of peeling or cracking of the interlayer connection conductor 300J and the electrode 215 at the bonding portion BP1, and occurrence of cracking to the interlayer connection conductor 300J are able to be significantly reduced or prevented.

Method of Manufacturing Resin Substrate

Hereinafter, a non-limiting example of a method of manufacturing the resin substrate 10J will be described. FIG. 22 is a flow chart of a method of manufacturing the resin substrate 10J. FIGS. 23A to 23E are cross-sectional views of a shape in a main step in the method of manufacturing the resin substrate 10J.

Figure 23A:
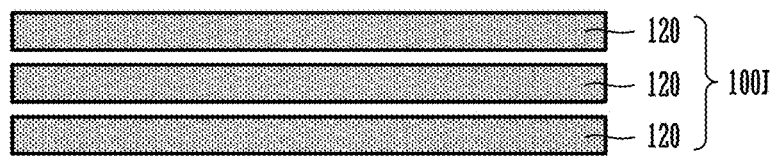
FIGS. 23A to 23E are side cross-sectional views of the method of manufacturing the resin substrate 10J according to the eighth preferred embodiment of the present invention.

As shown in FIG. 22 and FIG. 23A, a plurality of second resin layers 120 are prepared. Next, the plurality of second resin layers 120 are stacked to form a resin body 100J (S501).

Figure 23B:
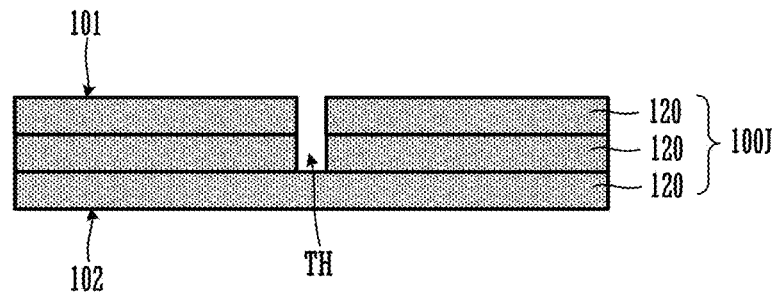

As shown in FIG. 22 and FIG. 23B, a hole TH extending from a first main surface 101 of the resin body 100J toward a second main surface 102 of the resin body 100J is formed by a drill or another suitable device (S502), for example. At this time, the hole TH is formed so as not to reach the second main surface 102. In other words, the hole TH is formed so as not to penetrate the second resin layer 120.

Figure 23C:
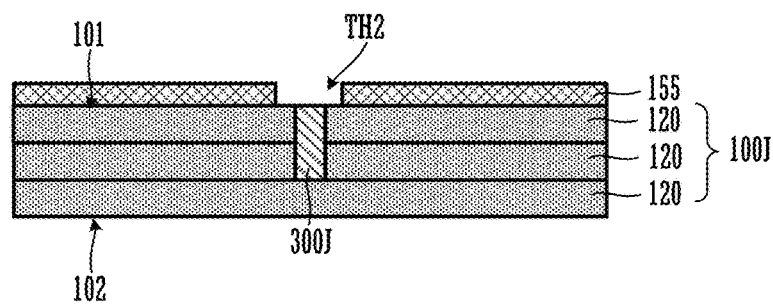

As shown in FIG. 22 and FIG. 23C, a metal body (a metal pin) is inserted in the hole TH (S503). The metal body provides the interlayer connection conductor 300J. Next, an adhesive layer 155 is formed on a first main surface 101. At such a time, the adhesive layer 155 includes a hole TH2 for a gap that is larger than the hole TH in a plan view. As a result, a gap GP to be described below is formed (S504).

Figure 23D:
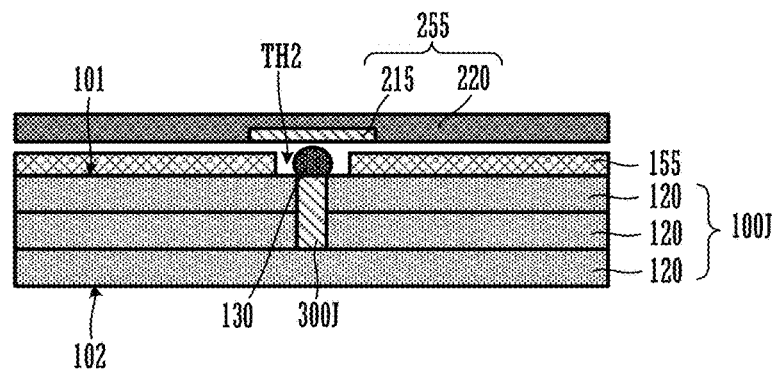

As shown in FIG. 22 and FIG. 23D, a component 255 obtained by combining the resin layer 220 with the electrode 215 is adhered to the adhesive layer 155. More specifically, the component 255 is adhered to the adhesive layer 155 so that the electrode 215 and the interlayer connection conductor 300J exposed to the first main surface 101 may come into contact with each other through solder 135 (S505). Next, a structure formed in Step S505 is heated and pressed (thermally pressed) (S506). Accordingly, a bonding portion BP1 is formed, and a gap GP is formed around the bonding portion BP1.

The resin body 100J is ground by a router or another suitable device, for example, from a surface of the resin body 100J opposite to a surface of the resin body 100J on which the resin layer 220 is provided, so as to expose the interlayer connection conductor (a metal body) 300J (S507).

Figure 23E:
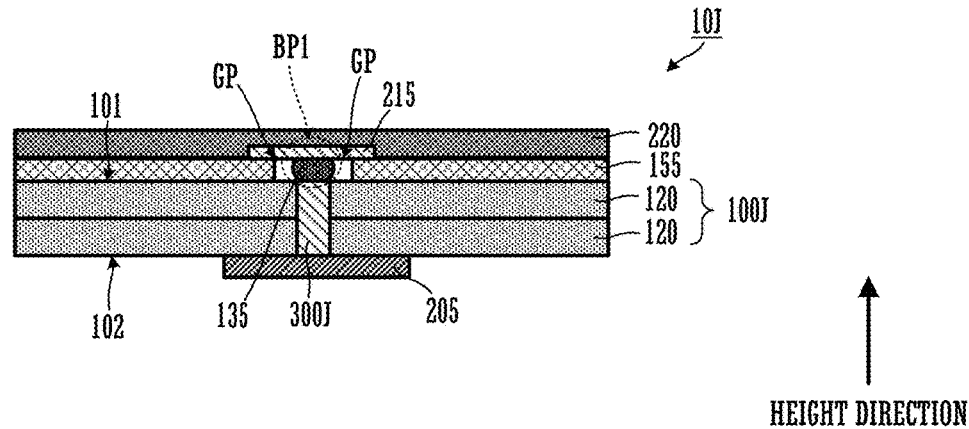

As shown in FIG. 22 and FIG. 23E, a terminal electrode 205 is formed by plating or the like, for example, on the surface of the resin body 100J to which the interlayer connection conductor 300J is exposed (S508).

The use of such a manufacturing method makes it possible to reliably and highly accurately achieve a configuration such as the above-described resin substrate 10J. In addition, the step of forming the hole TH2 larger than the hole TH in the adhesive layer 155, as shown in step S504, makes it possible to reliably and easily form the gap GP.

In a portion in which the adhesive layer 155 and the interlayer connection conductor 300J are in contact with each other, in the above-described configuration, the hole TH2 formed in Step S504, even when a flow occurs in the solder 135 or the adhesive layer 155, is preferably formed in such a size that the gap GP is able to be formed. In other words, the hole TH2 in the adhesive layer 155 may be formed according to the amount of flow of the solder 135 or the adhesive layer 155.

It is to be noted that, while the above-described configuration provides an example in which the resin substrate 10J is formed by a method of collectively stacking the second resin layers 120, a similar resin substrate 10J is able to be obtained also by the build-up method.

In addition, while the above-described configuration provides an example in which the resin body 100J is formed by using the second resin layers 120, the resin body 100J may be formed by using the first resin layers 110.

Ninth Preferred Embodiment

Figure 24A:
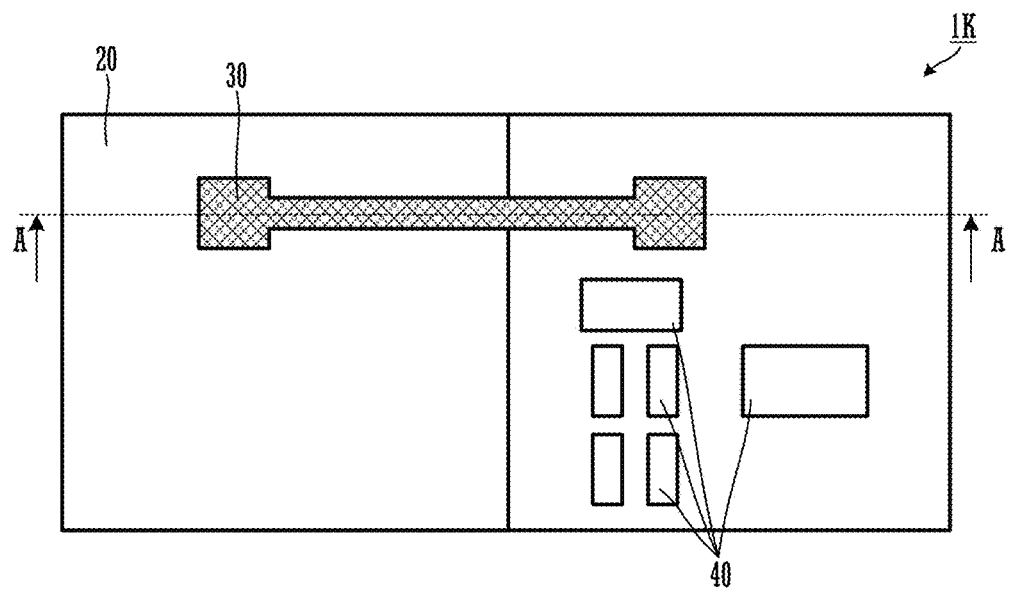
FIG. 24A is a plan view of an electronic device 1K including the resin substrate 10A, according to a ninth preferred embodiment of the present invention.

A resin substrate according to a ninth preferred embodiment of the present invention will be described with reference to the drawings. FIG. 24A is a plan view of an electronic device 1K including a transmission line member 30 including the resin substrate 10A according to the second preferred embodiment of the present invention, and FIG. 24B is a side cross-sectional view taken along an A-A line in FIG. 24A.

Figure 24B:
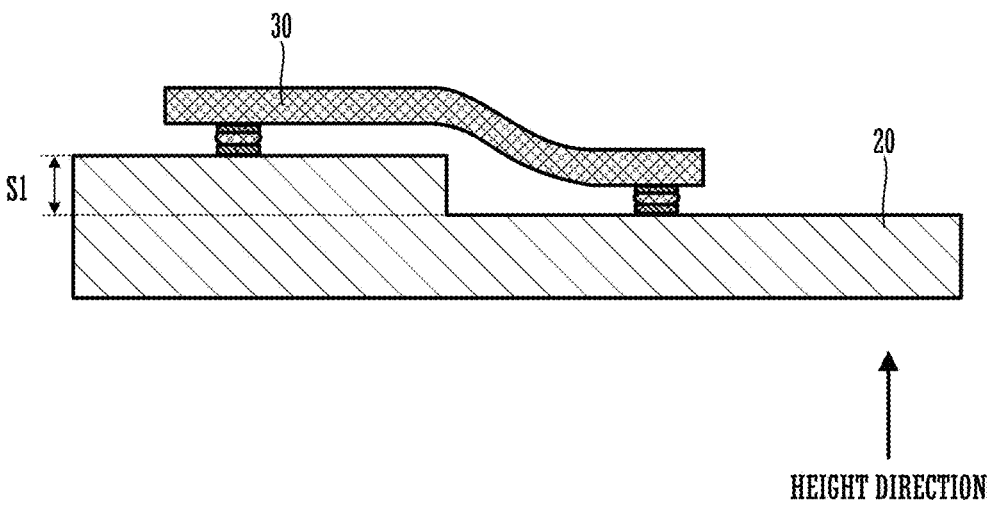
FIG. 24B is a side cross-sectional view taken along an A-A line in FIG. 24A.

As shown in FIGS. 24A and 24B, the transmission line member 30 according to the eighth preferred embodiment includes the resin substrate 10A (see FIG. 5) according to the second preferred embodiment. In addition, the transmission line member 30 is mounted on a circuit board 20 so as to be curved.

As shown in FIGS. 24A and 24B, the electronic device 1K includes a circuit board 20, a transmission line member 30, and a mounted component 40. In the height direction, a step difference S1 is provided on the first main surface of the circuit board 20.

The transmission line member 30 has flexibility.

The transmission line member 30 is mounted on the first main surface of the circuit board 20. More specifically, the transmission line member 30 is formed so as to cross the step difference S1 on the first main surface of the circuit board 20. In addition, a plurality of mounted components 40 are mounted on the first main surface of the circuit board 20.

As shown in FIG. 24B, the transmission line member 30 is mounted so as to cross the step difference S1 of the circuit board 20, so that bending stress is applied to the transmission line member 30. However, with the structure of the resin substrate 10A, peeling or cracking in the interlayer connection conductor 300A or the bonding portion BP4 of the interlayer connection conductor 300A and the conductor pattern 200 due to the stress may be significantly reduced or prevented.

Tenth Preferred Embodiment

Figure 25:
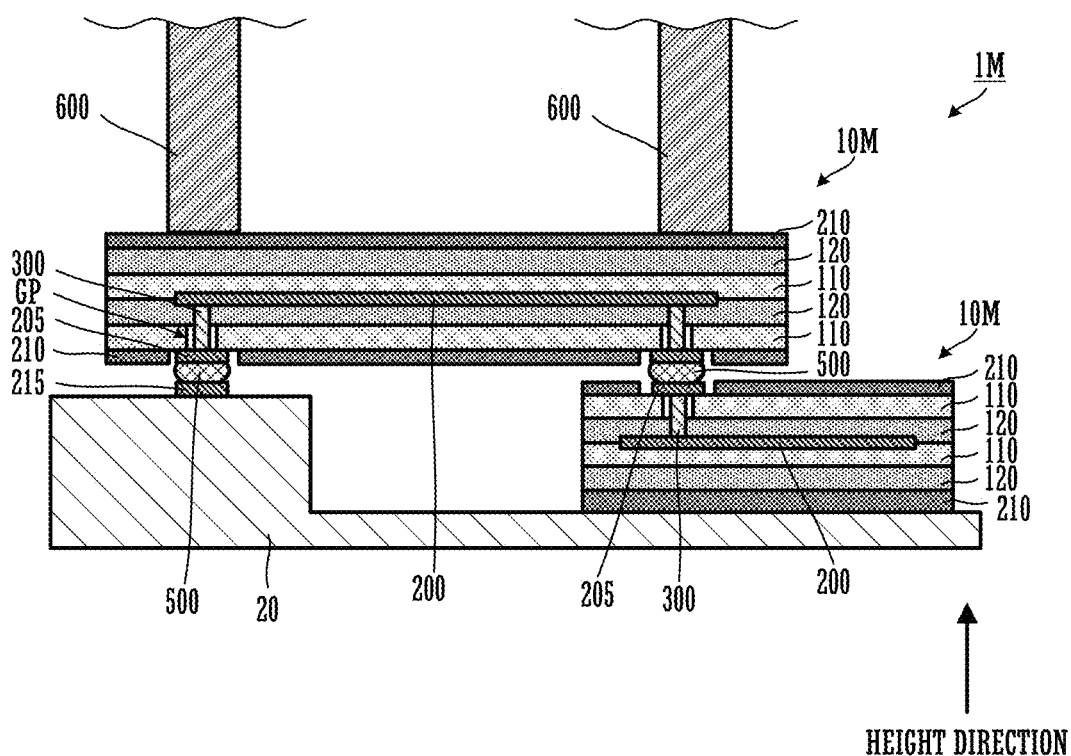
FIG. 25 is a side cross-sectional view of an electronic device 1M including a resin substrate 10M according to a tenth preferred embodiment of the present invention.

A resin substrate according to a tenth preferred embodiment of the present invention will be described with reference to the drawings. FIG. 25 is a side cross-sectional view of an electronic device 1M including a resin substrate 10M according to the tenth preferred embodiment of the present invention.

As shown in FIG. 25, the electronic device 1M according to the tenth preferred embodiment is different from the electronic device 1K according to the ninth preferred embodiment in that the resin substrate 10M and another circuit substrate 20 are connected to each other by using a hot bar 600. Other basic features of the electronic device 1M are the same as or similar to the basic features of the electronic device 1K, and a description of the same or similar features will be omitted.

A resin substrate 10M and a circuit board 20, and resin substrates 10M are mounted through a bonding layer 500. More specifically, the resin substrate 10M and the circuit board 20 are mounted by using a hot bar 600. In other words, the resin substrate 10M and the circuit board 20, and the resin substrates 10M are bonded by the instantaneous heating method. In such a case, heat and pressure are applied to the resin substrate 10M.

With the configuration of the resin substrate 10M, the gap GP is provided in the bonding portion of the interlayer connection conductor 300 and the terminal electrode 205, which makes it possible to significantly reduce or prevent stress due to the applied heat and pressure, to the interlayer connection conductor 300 and the bonding portion.

While the above-described preferred embodiments provide examples in which a gap is provided in one of the main surfaces of the resin body, the gap is able to be provided on both of the main surfaces (both main surfaces) of the resin body. Accordingly, peeling or cracking of the both sides of the bonding portion is able to be significantly reduced or prevented. It is to be noted that the present invention is not limited to the configuration of each of the above-described preferred embodiments but may be a variation in the combination of the preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin substrate comprising:
   a resin body including a gap;
   an interlayer connection conductor provided in the resin body; and
   a conductor pattern bonded to the interlayer connection conductor; wherein
   the resin body includes:
     a contact portion that contacts the interlayer connection conductor;
     a first resin layer with a first thermal expansion coefficient; and
     a second resin layer with a second thermal expansion coefficient;
   the first thermal expansion coefficient is greater than the second thermal expansion coefficient;

the gap is provided adjacent to or in a vicinity of a bonding portion in which the interlayer connection conductor and the conductor pattern are bonded to each other;

the gap is provided in the first resin layer; and the contact portion is provided in the second resin layer.

2. The resin substrate according to claim 1, wherein the resin substrate includes a plurality of resin bodies;

the plurality of the resin bodies are stacked so that second resin layers of the plurality of resin bodies are in contact with each other and interlayer connection conductors of the plurality of the resin bodies are overlapped with each other; and portions in which the interlayer connection conductors of the plurality of the resin bodies are bonded so as to come into contact with each other are bonded by a bonding layer.

3. The resin substrate according to claim 1, wherein the resin body includes a plurality of gaps.

4. The resin substrate according to claim 1, wherein the gap provided adjacent to or in a vicinity of the bonding portion of the interlayer connection conductor and the conductor pattern is also provided adjacent to or in a vicinity of both main surfaces of the resin body.

5. The resin substrate according to claim 1, wherein a thickness of the first resin layer is smaller than a thickness of the second resin layer.

6. The resin substrate according to claim 1, wherein the first resin layer is made of a fluororesin.

7. The resin substrate according to claim 1, wherein the conductor pattern and the interlayer connection conductor are made of a same material.

8. The resin substrate according to claim 1, wherein the interlayer connection conductor has a tapered shape.

9. The resin substrate according to claim 1, wherein the second resin layer is made of a liquid crystal polymer.

10. The resin substrate according to claim 1, wherein and intermetallic compound is provided at the bonding portion.

11. An electronic device comprising:

the resin substrate according to claim 1; and a circuit board on which the resin substrate is to be mounted.

12. The electronic device according to claim 11, wherein a surface of the circuit board on which the resin substrate is mounted includes a step difference; and the resin substrate is mounted so as to curve over the step difference.

13. The electronic device according to claim 11, wherein the resin substrate includes a plurality of resin bodies;

the plurality of the resin bodies are stacked so that second resin layers of the plurality of resin bodies are in contact with each other and interlayer connection conductors of the plurality of the resin bodies are overlapped with each other; and portions in which the interlayer connection conductors of the plurality of the resin bodies are bonded so as to come into contact with each other are bonded by a bonding layer.

14. The electronic device according to claim 11, wherein the resin body includes a plurality of gaps.

15. The electronic device according to claim 11, wherein the gap provided adjacent to or in a vicinity of the bonding portion of the interlayer connection conductor and the conductor pattern is also provided adjacent to or in a vicinity of both main surfaces of the resin body.

16. The electronic device according to claim 11, wherein a thickness of the first resin layer is smaller than a thickness of the second resin layer.

17. The electronic device according to claim 11, wherein the first resin layer is made of a fluororesin.

18. The electronic device according to claim 11, wherein the conductor pattern and the interlayer connection conductor are made of a same material.

19. The electronic device according to claim 11, wherein the interlayer connection conductor has a tapered shape.

20. The electronic device according to claim 11, wherein the second resin layer is made of a liquid crystal polymer.

* * * * *